(12) United States Patent (10) Patent No.: US 9,209,368 B2
Sabathil et al. (45) Date of Patent: Dec. 8, 2015

(54) OPTOELECTRONIC SEMI-CONDUCTOR COMPONENT

(71) Applicant: OSRAM Opto Semiconductors GmbH, Regensburg (DE)

(72) Inventors: Matthias Sabathil, Regensburg (DE); Stefan Illek, Donaustauf (DE); Thomas Schwarz, Regensburg (DE); Walter Wegleiter, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/424,796

(22) PCT Filed: Aug. 28, 2013

(86) PCT No.: PCT/EP2013/067812
§ 371 (c)(1),
(2) Date: Feb. 27, 2015

(87) PCT Pub. No.: WO2014/033166
PCT Pub. Date: Mar. 6, 2014

(65) Prior Publication Data
US 2015/0243857 A1 Aug. 27, 2015

(30) Foreign Application Priority Data
Aug. 31, 2012 (DE) .......................... 10 2012 215 524

(51) Int. Cl.
*H01L 33/00* (2010.01)
*H01L 33/56* (2010.01)
*H01L 33/38* (2010.01)
*H01L 33/40* (2010.01)
(Continued)

(52) U.S. Cl.
CPC ................ *H01L 33/56* (2013.01); *H01L 33/36* (2013.01); *H01L 33/38* (2013.01); *H01L 33/382* (2013.01); *H01L 33/385* (2013.01); *H01L 33/405* (2013.01); *H01L 33/54* (2013.01); *H01L 33/60* (2013.01); *H01L 33/62* (2013.01); *H01L 2924/0002* (2013.01); *H01L 2933/005* (2013.01); *H01L 2933/0058* (2013.01); *H01L 2933/0066* (2013.01)

(58) Field of Classification Search
USPC ..................................................... 257/98, 99
See application file for complete search history.

(56) References Cited

U.S. PATENT DOCUMENTS 8,653,540 B2  2/2014  Engl et al.
8,723,192 B2  5/2014  Weidner et al.
(Continued)

FOREIGN PATENT DOCUMENTS

DE  102007022947 A1  10/2008
DE  102009036621 A1   2/2011
(Continued)

*Primary Examiner* — Min-Loan Tran
(74) *Attorney, Agent, or Firm* — Slater & Matsil, L.L.P.

(57) ABSTRACT

An optoelectronic semi-conductor component includes an optoelectronic semi-conductor chip embedded into an electrically-insulating shaped body that has an upper face and a lower face. In the shaped body, an electrical via is also embedded which forms an electrically-conductive connection between the upper face and the lower face of the shaped body. On the upper face of the shaped body, a reflective layer is arranged which forms an electrically-conductive connection between an electrical semi-conductor chip contact and the via. The reflective layer covers at least 50% of the upper face of the shaped body.

17 Claims, 22 Drawing Sheets

(51) Int. Cl.
*H01L 33/36* (2010.01)
*H01L 33/62* (2010.01)
*H01L 33/54* (2010.01)
*H01L 33/60* (2010.01)

(56) References Cited

U.S. PATENT DOCUMENTS

| | | |
|---|---|---|
| 8,901,592 B2 | 12/2014 | Weidner et al. |
| 2005/0127485 A1 | 6/2005 | Shei et al. |
| 2011/0210370 A1* | 9/2011 | Kamamori ............... H01L 33/62 257/99 |
| 2012/0193655 A1 | 8/2012 | Sirringhaus et al. |
| 2012/0212124 A1* | 8/2012 | Sawai .................. H01L 33/60 313/498 |
| 2013/0214323 A1 | 8/2013 | Weidner et al. |
| 2013/0256740 A1 | 10/2013 | Ahlstedt et al. |
| 2014/0034983 A1 | 2/2014 | Gebuhr et al. |
| 2014/0227811 A1 | 8/2014 | Gebuhr et al. |

FOREIGN PATENT DOCUMENTS

| | | |
|---|---|---|
| DE | 102010034565 A1 | 2/2012 |
| DE | 102010045403 A1 | 3/2012 |
| DE | 102010049961 A1 | 5/2012 |
| DE | 102011011139 A1 | 8/2012 |
| DE | 102011055549 A1 | 4/2013 |
| EP | 1708283 A1 | 10/2006 |

* cited by examiner

OPTOELECTRONIC SEMI-CONDUCTOR COMPONENT

This patent application is a national phase filing under section 371 of PCT/EP2013/067812, filed Aug. 28, 2013, which claims the priority of German patent application 10 2012 215 524.4, filed Aug. 31, 2012, each of which is incorporated herein by reference in its entirety.

TECHNICAL FIELD

The present invention relates to an optoelectronic semiconductor component and to a method for producing an optoelectronic semiconductor component.

BACKGROUND

German Patent Publication DE 10 2009 036 621 A1 (U.S. Pat. No. 8,723,192 B2) discloses a method for producing an optoelectronic semiconductor component, in which optoelectronic semiconductor chips are embedded into a mold body that covers all side surfaces of the optoelectronic semiconductor chips. Top sides and undersides of the optoelectronic semiconductor chips preferably remain free. Contact locations can be provided at the top sides and/or undersides of each semiconductor chip. Together with the optoelectronic semiconductor chips, electrical plated-through holes can be embedded into the mold body. By means of an electrically conductive connection of a surface of the mold body, a contact location of a semiconductor chip can be electrically conductively connected to a plated-through hole.

SUMMARY

Embodiments of the present invention provide an optoelectronic semiconductor component. Further embodiments of the present invention specify a method for producing an optoelectronic semiconductor component.

An optoelectronic semiconductor component comprises an optoelectronic semiconductor chip, which is embedded into an electrically insulating mold body having a top side and an underside. In this case, a through contact is embedded into the mold body, which forms an electrically conductive connection between the top side and the underside of the mold body. Moreover, a reflective layer is arranged on the top side of the mold body, said reflective layer forming an electrically conductive connection between an electrical contact of the semiconductor chip and the through contact. In this case, the reflective layer covers at least 50% of the top side of the mold body. Advantageously, in the case of this optoelectronic semiconductor component, the reflective layer simultaneously fulfills the function of forming an electrically conductive connection between the electrical contact of the semiconductor chip and the through contact, and the function of embodying the top side of the mold body of the optoelectronic semiconductor component in a reflective fashion, that is to say of reflectively coating said top side. The reflective top side of the mold body of the semiconductor component prevents absorption of light in the material of the mold body, which advantageously increases an effectively usable luminous power of the optoelectronic semiconductor component. The double function of the reflective layer on the top side of the mold body allows the optoelectronic semiconductor component to be embodied very compactly and produced cost-effectively. By virtue of the fact that the electrically conductive connection between the electrical contact of the semiconductor chip and the through contact is formed by the reflective layer, the optoelectronic semiconductor component is additionally more robust than would be the case with the use of bonding wires.

In one embodiment of the optoelectronic semiconductor component, a top side of the semiconductor chip is oriented in the same direction as the top side of the mold body. In this case, the top side of the semiconductor chip is a radiation emission surface of the semiconductor chip. In this case, at least one part of the top side of the semiconductor chip is covered neither by the mold body nor by the reflective layer. In the case of this semiconductor component, light can be coupled out from the optoelectronic semiconductor chip through the top side of the semiconductor chip, without the emergence of radiation being impeded or restricted by the mold body or the reflective layer.

In one embodiment of the optoelectronic semiconductor component, in the region of the electrically conductive connection between the electrical contact of the semiconductor chip and the through contact a dielectric is arranged between the top side of the mold body and the reflective layer. Advantageously, the dielectric prevents an electrical short circuit or flashover between the reflective layer and a potential-carrying region of the optoelectronic semiconductor chip. Advantageously, the dielectric can be arranged on the top side of the mold body by simple and cost-effective processes.

In one embodiment of the optoelectronic semiconductor component, the dielectric comprises benzocyclobutene. This advantageously enables simple processing of the dielectric. Moreover, benzocyclobutene has a sufficient electrical breakdown strength.

In one embodiment of the optoelectronic semiconductor component, the dielectric has a thickness of between 50 nm and 500 nm. Advantageously, the dielectric then affords a sufficient insulation strength in the case of electrical voltages that typically occur during the operation of the optoelectronic semiconductor component.

In one embodiment of the optoelectronic semiconductor component, a first section of the reflective layer is electrically insulated from a second section of the reflective layer. In this case, the first section forms the electrically conductive connection between the electrical contact of the semiconductor chip and the through contact. Advantageously, the first section and the second section of the reflective layer can then be at different electrical potentials during the operation of the optoelectronic semiconductor component. Nevertheless, the first section and the second section of the reflective layer can advantageously be produced jointly, as a result of which the optoelectronic semiconductor component is obtainable simply and cost-effectively.

In one embodiment of the optoelectronic semiconductor component, the mold body covers a part of the top side of the semiconductor chip. Advantageously, that part of the mold body which covers the top side of the semiconductor chip in this embodiment can provide an electrical insulation between the electrically conductive connection between the electrical contact of the semiconductor chip and the through contact and a potential-carrying section of the optoelectronic semiconductor chip, as a result of which short circuits and electrical flashovers are prevented.

In one embodiment of the optoelectronic semiconductor component, the mold body above the part of the top side of the semiconductor chip has a thickness of between 50 nm and 500 nm. Advantageously, that part of the mold body which covers the part of the top side of the semiconductor chip in this semiconductor component forms a sufficient electrical breakdown strength for electrical voltages that usually occur during the operation of the optoelectronic semiconductor component.

In one embodiment of the optoelectronic semiconductor component, the reflective layer comprises silver or aluminum. Advantageously, the reflective layer in this embodiment affords a high optical reflectivity and a good electrical conductivity.

A method for producing an optoelectronic semiconductor component comprises steps for embedding an optoelectronic semiconductor chip and a through contact into a mold body having a top side and an underside, wherein the through contact forms an electrically conductive connection between the top side and the underside of the mold body, for arranging a reflective layer on the top side of the mold body, wherein the reflective layer forms an electrically conductive connection between an electrical contact of the semiconductor chip and the through contact, and wherein the reflective layer covers at least 50% of the top side of the mold body. Advantageously, the reflective layer of the optoelectronic semiconductor component produced according to this method simultaneously fulfills the function of providing an electrically conductive connection between the electrical contact of the semiconductor chip and the through contact, and the function of providing the mold body of the optoelectronic semiconductor component with a reflective top side. As a result, the method can be carried out simply and cost-effectively. In particular, it is advantageously not necessary to produce wire bonding connections.

In one embodiment of the method, in the region of the electrically conductive connection between the electrical contact of the semiconductor chip and the through contact a dielectric is arranged between the top side of the mold body and the reflective layer. Advantageously, the dielectric can electrically insulate the reflective layer from potential-carrying parts of the optoelectronic semiconductor chip, as a result of which short circuits and/or flashovers are prevented.

In one embodiment of the method, the dielectric is arranged on the top side of the mold body by means of a first photolithographic process steps. Advantageously, the dielectric can then be arranged with high precision and reproducibility.

In one embodiment of the method, the reflective layer is arranged and patterned on the top side of the mold body by means of a second photolithographic process step. Advantageously, the reflective layer can then also be arranged with high accuracy and reproducibility.

In one embodiment of the method, a first photoresist is arranged on a top side of the semiconductor chip before the semiconductor chip is embedded into the mold body. Advantageously, the first photoresist can then serve for protecting a radiation emission surface on the top side of the semiconductor chip.

In one embodiment of the method, the first photoresist is arranged on the top side of the semiconductor chip while the semiconductor chip is situated in a wafer assemblage with further semiconductor chips. Advantageously, the first photoresist is then arranged for many semiconductor chips simultaneously, as a result of which the costs for carrying out the method per semiconductor chip are drastically reduced.

In one embodiment of the method, a second photoresist is arranged on the top side of the mold body before the reflective layer is arranged on the top side of the mold body. Advantageously, the process of arranging the second photoresist on the top side of the mold body and a second phototechnique for producing the reflective layer on the top side of the mold body can then be carried out non-critically by coarse methods, as a result of which the costs for carrying out the method are reduced.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, in which in each case in highly schematic illustration.

DETAILED DESCRIPTION OF ILLUSTRATIVE EMBODIMENTS

Figure 1:
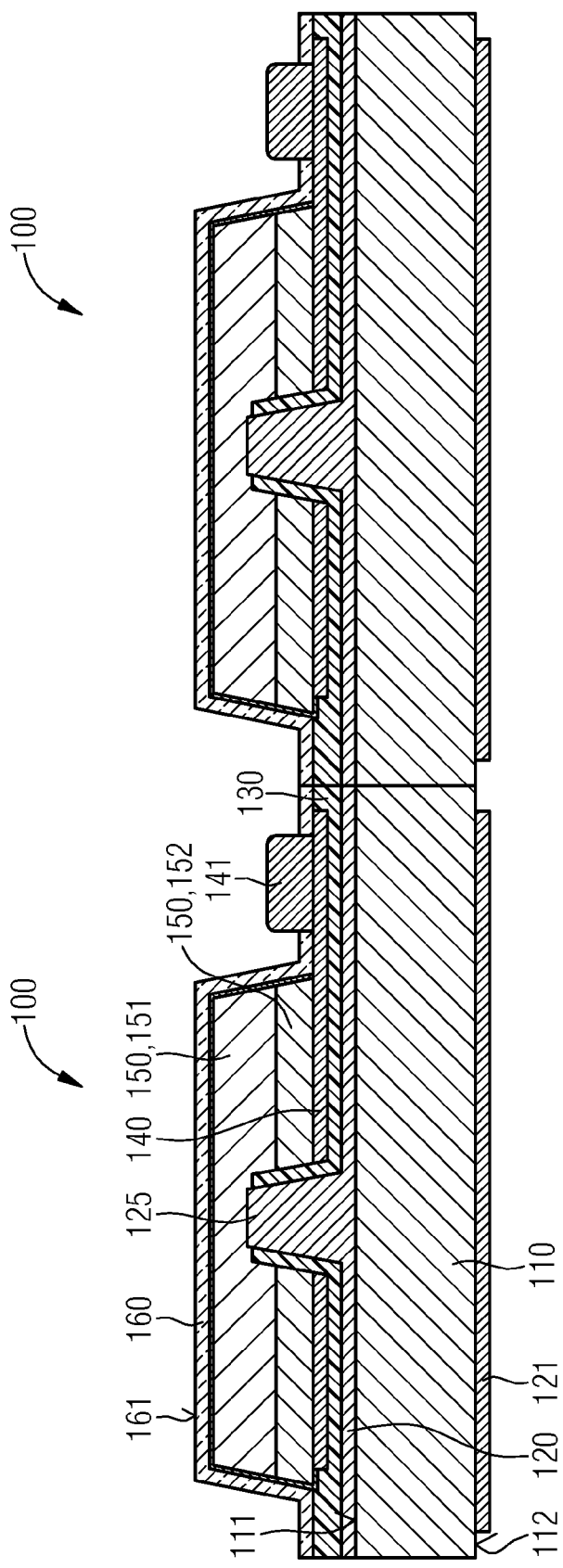
FIG. 1 shows a sectional illustration of two optoelectronic semiconductor chips for producing an optoelectronic semiconductor component in accordance with a first embodiment in a wafer assemblage.

FIG. 1 shows a sectional view through two optoelectronic semiconductor chips 100 in schematic illustration. The optoelectronic semiconductor chips 100 can be LED chips (light emitting diodes), for example. The optoelectronic semiconductor chips 100 have been embodied identically or approximately identically and produced in parallel with one another in joint work operations. In the illustration in FIG. 1, the optoelectronic semiconductor chips 100 are arranged laterally alongside one another and still connected to one another. The optoelectronic semiconductor chips 100 can be situated, for example, jointly with a multiplicity of further optoelectronic semiconductor chips 100 in a wafer assemblage. The optoelectronic semiconductor chips 100 are described further by way of example on the basis of one of the optoelectronic semiconductor chips 100.

The optoelectronic semiconductor chip 100 comprises a substrate 110 having a top side 111 and an underside 112. The substrate 110 is electrically conductive and can comprise silicon, for example. A first contact area 121 is arranged on the underside 112 of the substrate 111, said first contact area being electrically conductive and comprising a metal, for example.

A semiconductor 150 having an n-doped region 151 and a p-doped region 152 is arranged on the top side 111 of the substrate 110 of the optoelectronic semiconductor chip 100. The p-doped region 152 faces the top side 111 of the substrate 110. The n-doped region 151 faces away from the top side 111 of the substrate 110. The semiconductor 150 is an epitaxially grown semiconductor crystal and can comprise gallium nitride (GaN), for example.

The n-doped region 151 of the semiconductor 150 and the side surfaces of the semiconductor 150 are covered by an electrically insulating passivation 160. An electrically conductive second metallization 140 is arranged on the surface of the p-doped region 152 of the semiconductor 150. The second metallization 140 forms an electrical contact with the p-doped region 152 of the semiconductor 150 and simultaneously serves as a mirror layer for reflecting light emitted in the semiconductor 150 in the direction of the substrate 110. Laterally alongside the semiconductor 150, the second metallization 140 is connected to a second contact area 141 composed of electrically conductive material, which is arranged in a cutout of the passivation 160 and thus penetrates through the passivation 160.

On the side facing away from the semiconductor 150, the second metallization 140 is covered by an insulation layer 130, which has an electrically insulating effect. A first metallization 120 is arranged on that side of the insulation layer 130 which faces away from the second metallization 140, said first metallization being electrically insulated from the second metallization 140 by the insulation layer 130.

The optoelectronic semiconductor chip 100 has a through contact 125. The through contact 125 is embodied as an opening extending through the entire p-doped region 152 right into the n-doped region 151. The walls of the opening are electrically insulated by sections of the insulation layer 130. The opening of the through contact 125 is filled with an electrically conductive material that is electrically conductively connected to the first metallization 120. The first metallization 120 and the filling of the through contact 125 can comprise the same material, for example. Via the through contact 125 there is an electrically conductive connection between the first metallization 120 and the n-doped region 151 of the semiconductor 150.

The first metallization 120 is arranged on the top side 111 of the substrate 110 of the optoelectronic semiconductor chip 100. The semiconductor 150 may first have been produced independently of the substrate 110 and provided with the passivation 160, the second metallization 140, the through contact 125, the insulation layer 130 and the first metallization 120 and only then have been arranged on the top side 111 of the substrate 110. In this case, first an electrically conductive solder layer was applied to the top side 111 of the substrate 110. The solder layer on the top side 111 of the substrate 110 was then connected to the first metallization 120 by epitaxial bonding. Alternatively, the passivation 160 may also only have been produced after the semiconductor 150 had been arranged on the top side 111 of the substrate 110.

The first contact area 121 at the underside 112 of the substrate 110 is electrically conductively connected to the n-doped region 151 of the semiconductor 150 by means of the electrically conductive substrate 110, the first metallization 120 and the through contact 125. The second contact area 141 is electrically conductively connected to the p-doped region 152 by means of the second metallization 140. By applying an electrical voltage between the first contact area 121 and the second contact area 141 it is possible to excite a current flow through the semiconductor 150 which brings about emission of radiation.

That surface of the n-doped region 151 of the semiconductor 150 which is protected by the passivation 160 constitutes an emission region 161 or a radiation emission surface of the optoelectronic semiconductor chip 100. Light generated in the semiconductor 150 can be guided out of the optoelectronic semiconductor chip 100 through the emission region 161. Light emitted in the direction of the substrate 110 is reflected beforehand at the second metallization 140.

A method which serves to produce an optoelectronic semiconductor component comprising the optoelectronic semiconductor chip 100 is explained below with reference to FIGS. 2 to 9. For this purpose, firstly, the optoelectronic semiconductor chips 100 of the assemblage shown in FIG. 1 are separated from one another and processed further individually.

Figure 2:
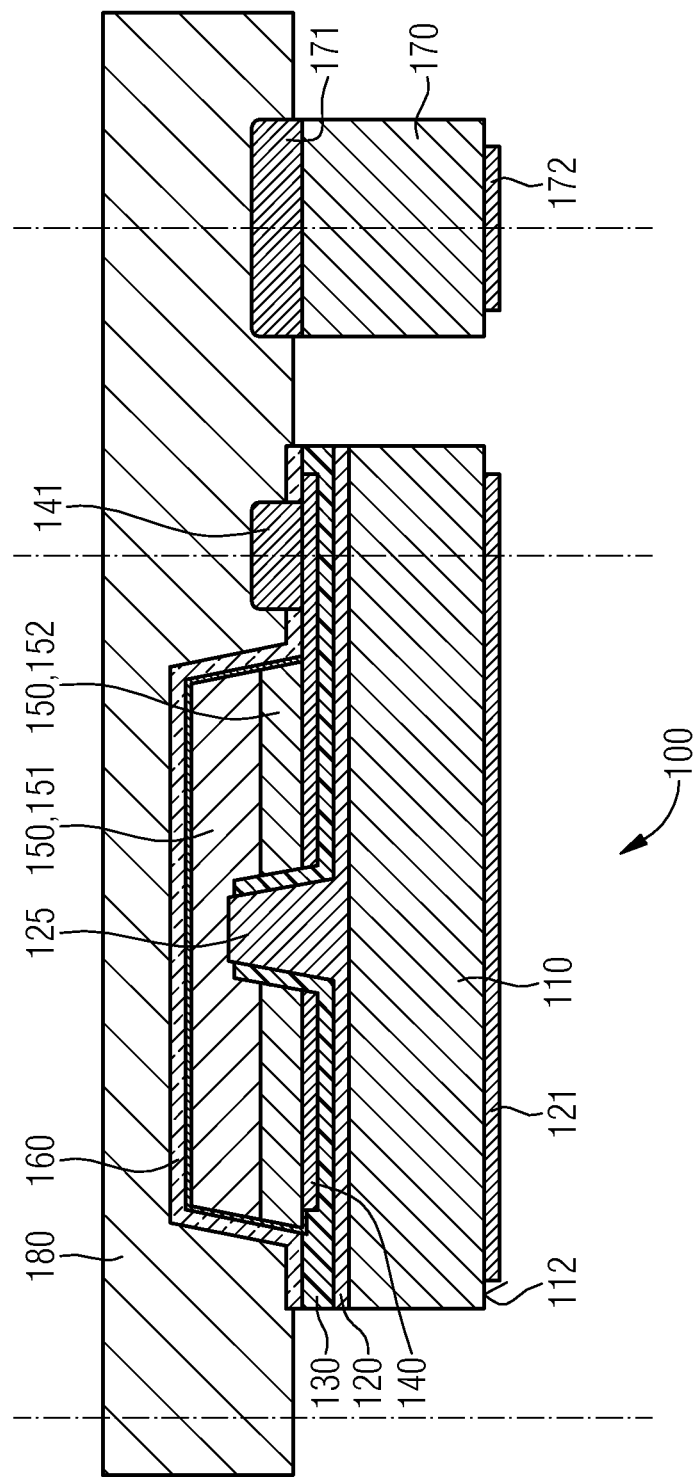
FIG. 2 shows a second processing state during the production of the optoelectronic semiconductor component in accordance with the first embodiment.

That side of the substrate 110 of the optoelectronic semiconductor chip 100 which has the semiconductor 150 is then pressed into a film 180, as is illustrated in FIG. 2. The film 180 is a soft film held by a carrier, which is not illustrated separately in FIG. 2. The optoelectronic semiconductor chip 100 is pressed into the film 180 to an extent such that the layers 120, 130, 160 arranged on the top side 111 of the substrate 110 bear flush against the film 180. Consequently, no gap remains between the passivation 160 and the film 180. The side surfaces of the optoelectronic semiconductor chip 100 are not pressed into the film 180. Consequently, the passivation 160 and the second contact area 141 of the optoelectronic semiconductor chip 100 are covered and protected by the film 180, while all other surfaces of the optoelectronic semiconductor chip 100 remain completely uncovered and free.

FIG. 2 additionally shows a conductor pin 170 composed of an electrically conductive material. An electrically conductive top side metallization 171 is arranged on a top side of the conductor pin 170. An electrically conductive underside metallization 172 is arranged on an underside of the conductor pin 170. The conductor pin 170 can consist of a printed circuit board material, for example, and electrically conductively connects the top side metallization 171 to the underside metallization 172. The length of the conductor pin 170 is dimensioned such that the distance between the top side metallization 171 and the underside metallization 172 corresponds approximately to the distance between the second contact area 141 and the first contact area 121 of the optoelectronic semiconductor chip 100.

The conductor pin 170 is arranged laterally alongside the optoelectronic semiconductor chip 100. The top side metallization 171 faces the film 180 and is pressed into the film 180 in such a way that the surface of the top side metallization 171 is covered and protected by the film 180.

The optoelectronic semiconductor chip 100 and the conductor pin 170 can be held in the position illustrated in FIG. 2 by means of a holding device (not shown). In particular, the optoelectronic semiconductor chip 100 and the conductor pin 170 can be held by a second carrier and a second film, which is arranged at the side of the first contact area 121 and the underside metallization 172 and covers and protects the first contact area 121 and the underside metallization 172.

In a subsequent method step, the optoelectronic semiconductor chip 100 and the conductor pin 170 are embedded into a mold body 190. For this purpose, the optoelectronic semiconductor chip 100 and the conductor pin 170 are surrounded with a molding compound in a molding process. If the underside 112 of the substrate 110 with the first contact area 121 and the underside of the conductor pin 170 with the underside metallization 172 are arranged on a carrier or a film, the molding compound is introduced between the film 180 and the lower carrier.

Figure 3:
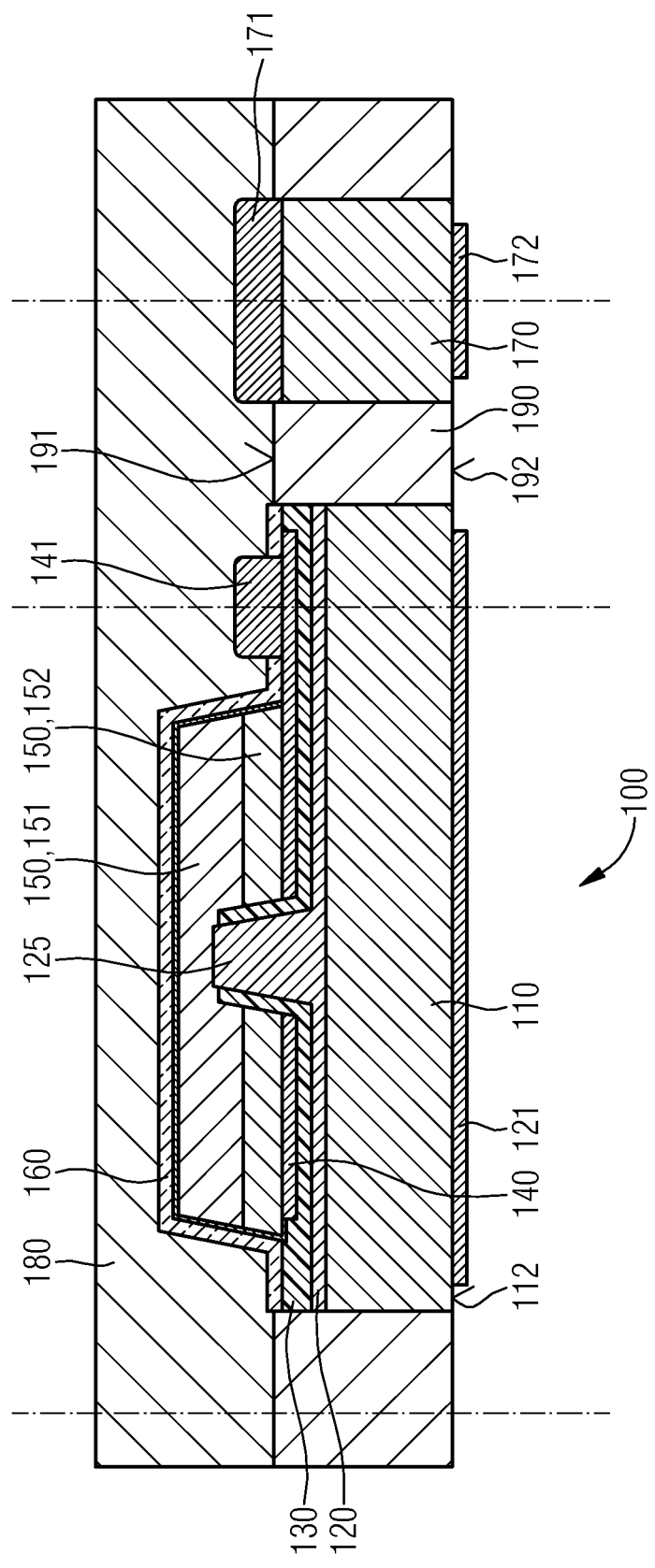
FIG. 3 shows a third processing state during the production of the optoelectronic semiconductor component in accordance with the first embodiment.

FIG. 3 shows a sectional view through the resulting mold body 190 with the embedded optoelectronic semiconductor chip 100 and the conductor pin 170 likewise embedded into the mold body 190. A lower carrier possibly present or a lower film is not shown in this case. The mold body 190 comprises an electrically insulating material.

Figure 4:
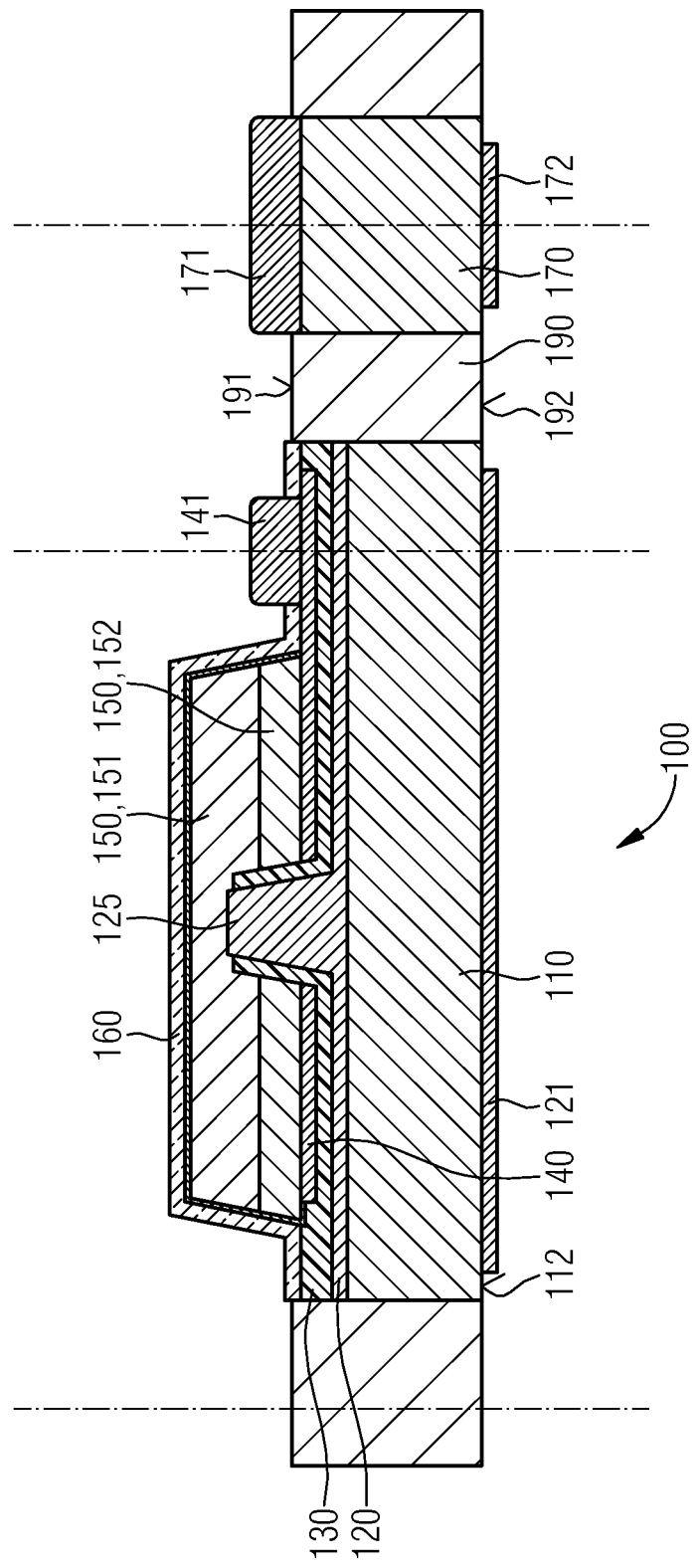
FIG. 4 shows a fourth processing state during the production of the optoelectronic semiconductor component in accordance with the first embodiment.

FIG. 4 shows a sectional view through the mold body 190 with the embedded optoelectronic semiconductor chip 100 and the embedded conductor pin 170 after the removal of the film 180. The mold body 190 has a top side 191 and an underside 192. The top side 191 of the mold body 190 terminates flush with the passivation 160 of the optoelectronic semiconductor chip 100. The second contact area 141 of the optoelectronic semiconductor chip 100 was protected by the film 180 and is now raised above the top side 191 of the mold body 190 and therefore accessible. The top side of the top side metallization 171 of the conductor pin 170 was also protected by the film 180 and is now not covered by the mold body 190, but rather accessible above the top side 191 of the mold body 190. The underside 192 of the mold body 190 terminates flush with the underside 112 of the substrate 110 and the underside of the conductor pin 170. Therefore, the first contact area 121 at the underside 112 of the substrate 110 of the optoelectronic semiconductor chip 100 and the underside metallization 172 of the conductor pin 170 are not covered by the mold body 190, but rather are accessible at the underside 192 of the mold body 190.

Figure 5:
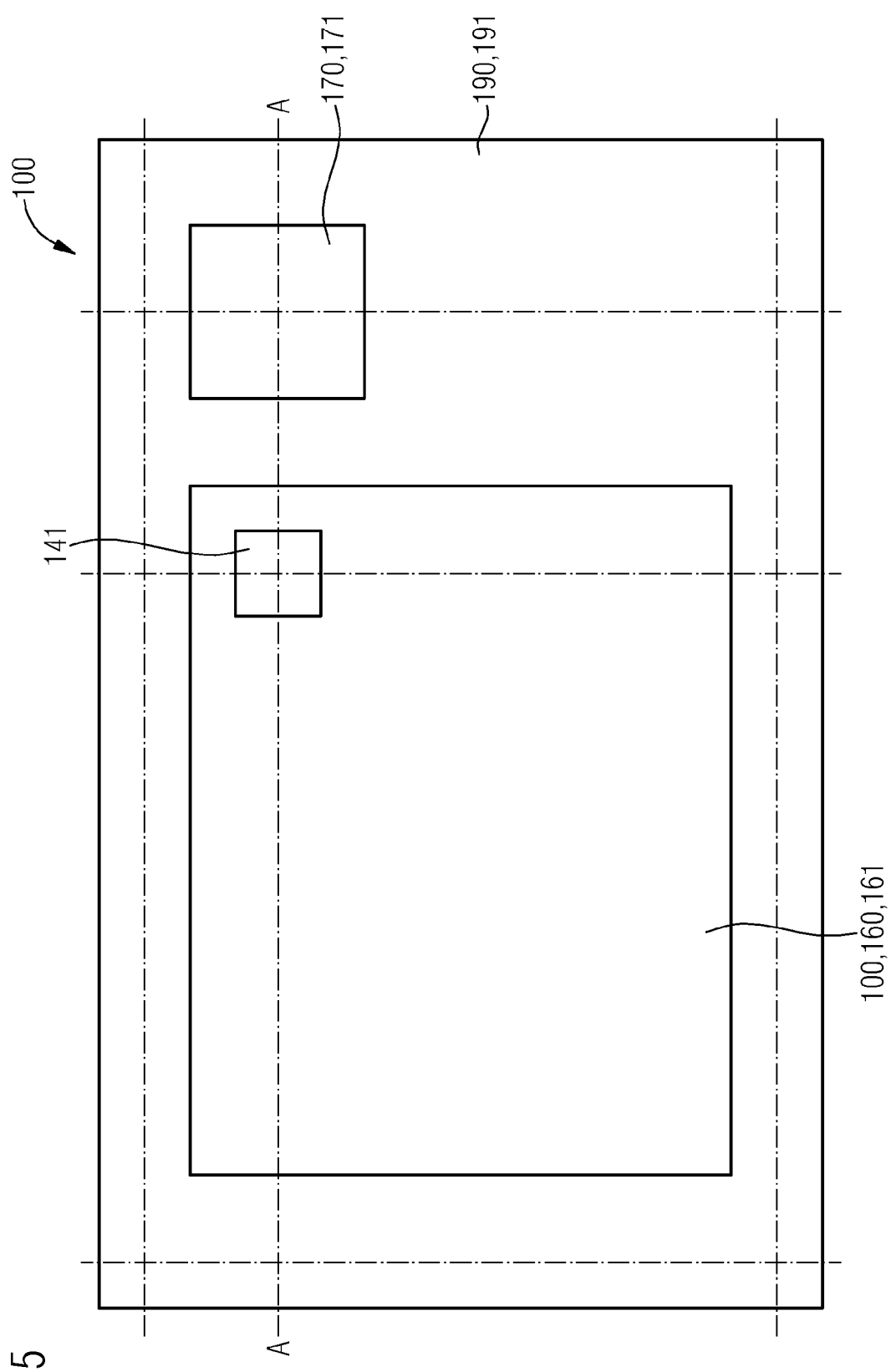
FIG. 5 shows a plan view of the optoelectronic semiconductor component in accordance with the first embodiment in the fourth processing state.

FIG. 5 shows a plan view of the top side 191 of the mold body 190 with the optoelectronic semiconductor chip 100 embedded therein and the conductor pin 170 likewise embedded into the mold body 190. The passivation 160 on the top side of the optoelectronic semiconductor chip 100 with the emission region 161, the second contact area 141 of the optoelectronic semiconductor chip 100 and the top side metallization 171 of the conductor pin 170 are visible. FIG. 5 likewise illustrates a sectional line AA, along which the mold body 190, the optoelectronic semiconductor chip 100 and the conductor pin 170 are cut in sectional view in the illustration in FIG. 4.

Figure 6:
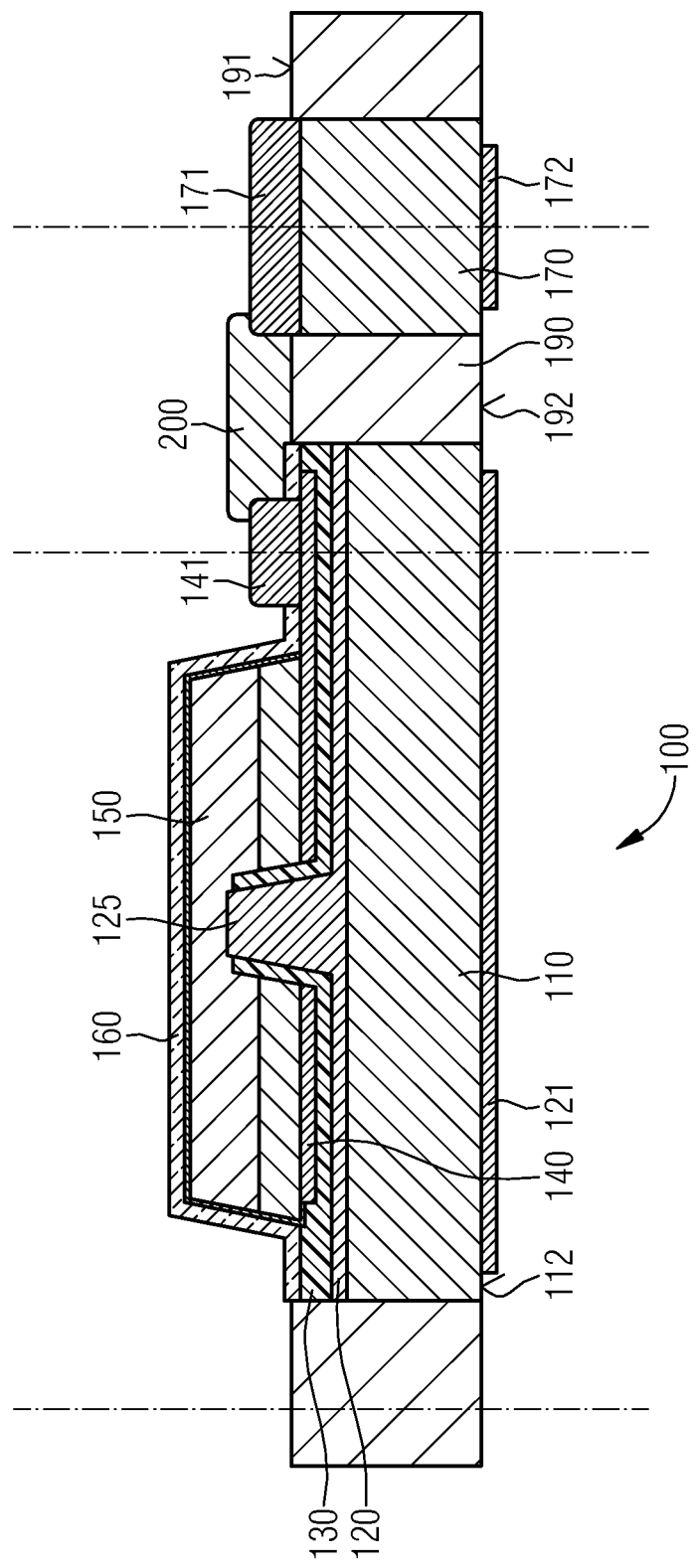
FIG. 6 shows a sectional view through the optoelectronic semiconductor component in accordance with the first embodiment in a fifth processing state.
Figure 7:
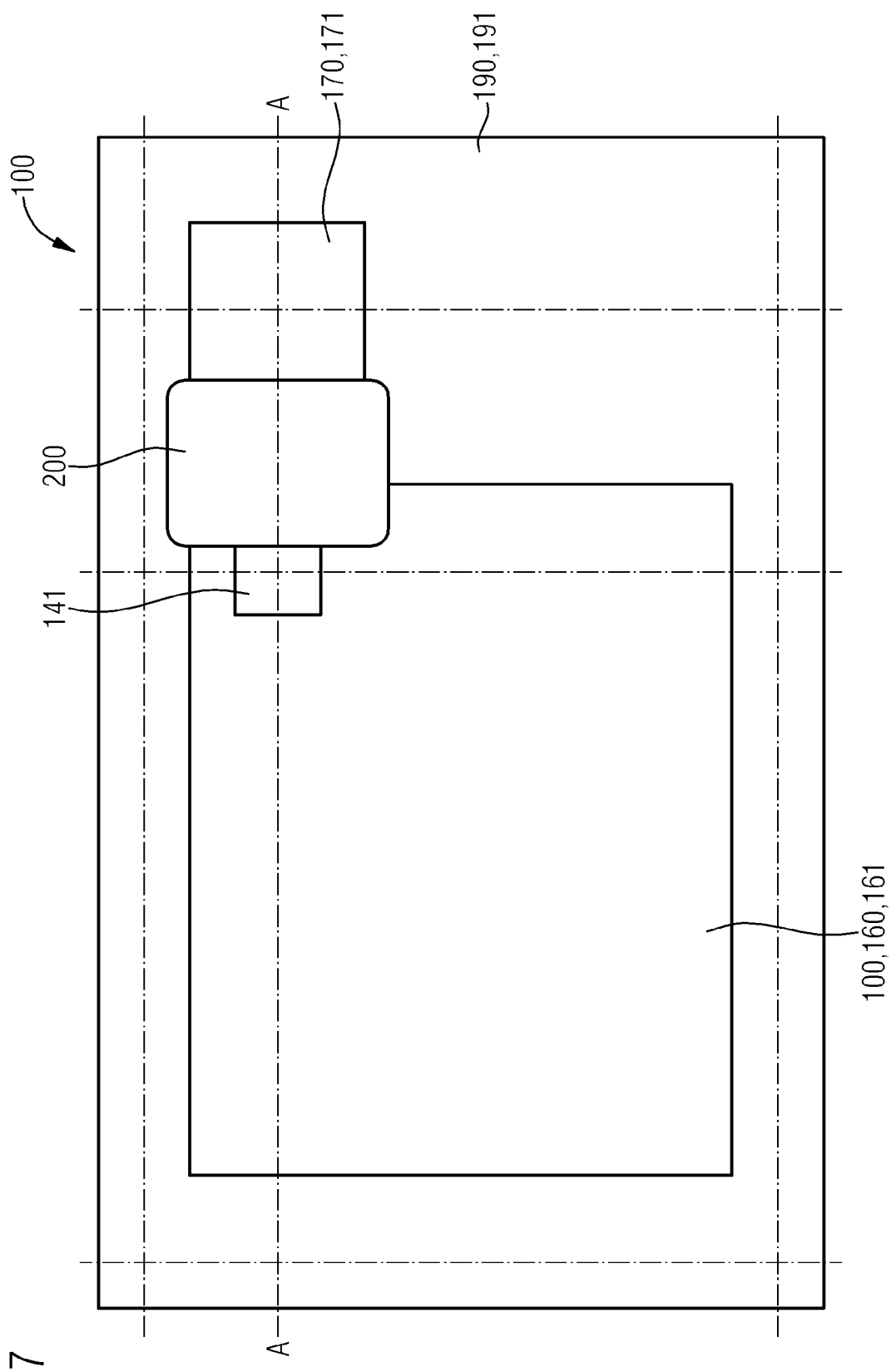
FIG. 7 shows a plan view of the optoelectronic semiconductor component in accordance with the first embodiment in the fifth processing state.

In a subsequent method step, an insulation section 200 is created on the top side 191 of the mold body 190 by means of a photolithographic method. Alternatively, the insulation section 200 can be created by stencil printing, by screen printing, by jetting, by dispensing, by stamping or by some other method. FIG. 6 shows a sectional illustration of the mold body 190 with the embedded optoelectronic semiconductor chip 100, the embedded conductor pin 170 and the insulation section 200 arranged on the top side 191 of the mold body 190. FIG. 7 shows a plan view of the top side 191 of the mold body 190 with the insulation section 200 arranged thereon.

The insulation section 200 is arranged in a lateral region between the second contact area 141 of the optoelectronic semiconductor chip 100 and the top side metallization 171 of the conductor pin 170 on the top side 191 of the mold body 190. The insulation section 200 comprises an electrically insulating material. By way of example, the insulation section 200 can comprise a dielectric such as benzocyclobutene (BCB). Alternatively, the insulation section 200 can comprise organic materials such as acrylates, epoxides, silicones, polyimides, or inorganic materials such as silicon oxide, silicon nitride. The insulation section 200 has a thickness that suffices to prevent an electrical breakdown if an electrical voltage corresponding to a maximum voltage occurring during the operation of the optoelectronic semiconductor chip 100 is applied across the insulation section 200. By way of example, the insulation section 200 can have a thickness that suffices to prevent an electrical breakdown if a voltage of 5 V is applied across the insulation section 200 in the thickness direction. The insulation section 200 preferably has a thickness of between 50 nm and 2 µm, particularly preferably a thickness of between 50 nm and 500 nm, for example, a thickness of 200 nm. If the insulation section 200 is applied by means of jetting or by a screen printing process, however, the thickness can also be several pm and can be in the range of between 20 µm and 100 µm, for example.

Figure 8:
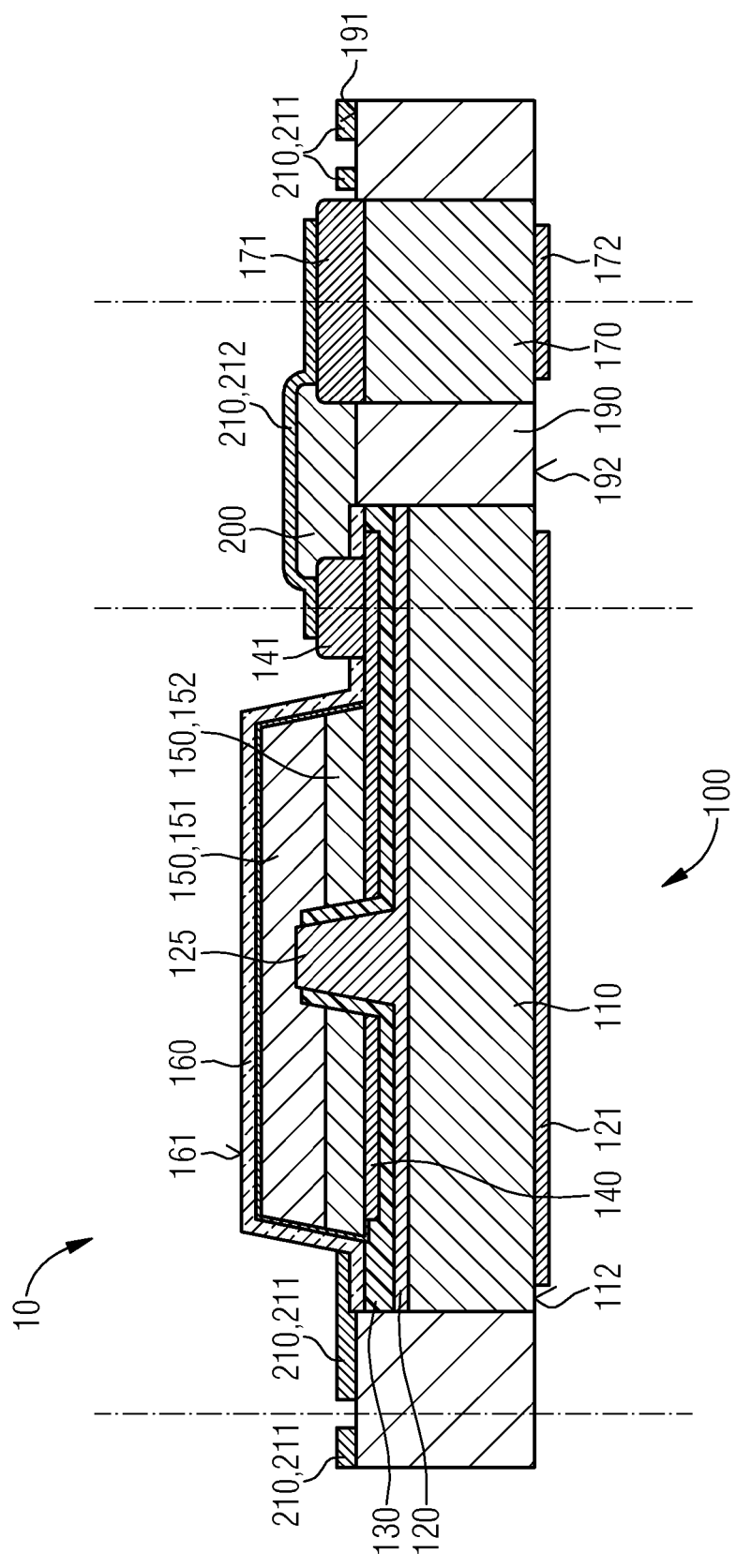
FIG. 8 shows a sectional view through the optoelectronic semiconductor component in accordance with the first embodiment.
Figure 9:
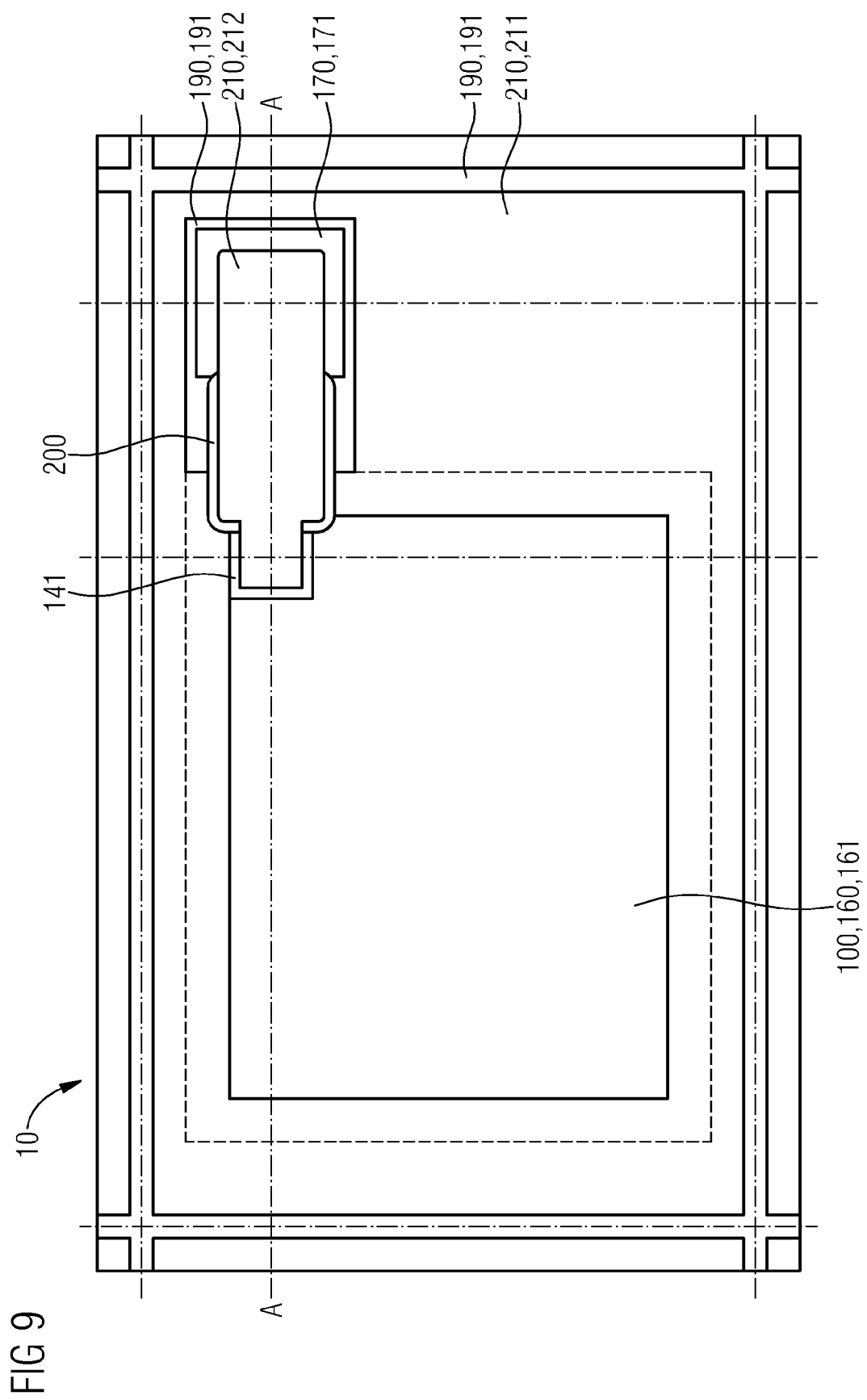
FIG. 9 shows a plan view of the optoelectronic semiconductor component of the first embodiment.
Figure 10:
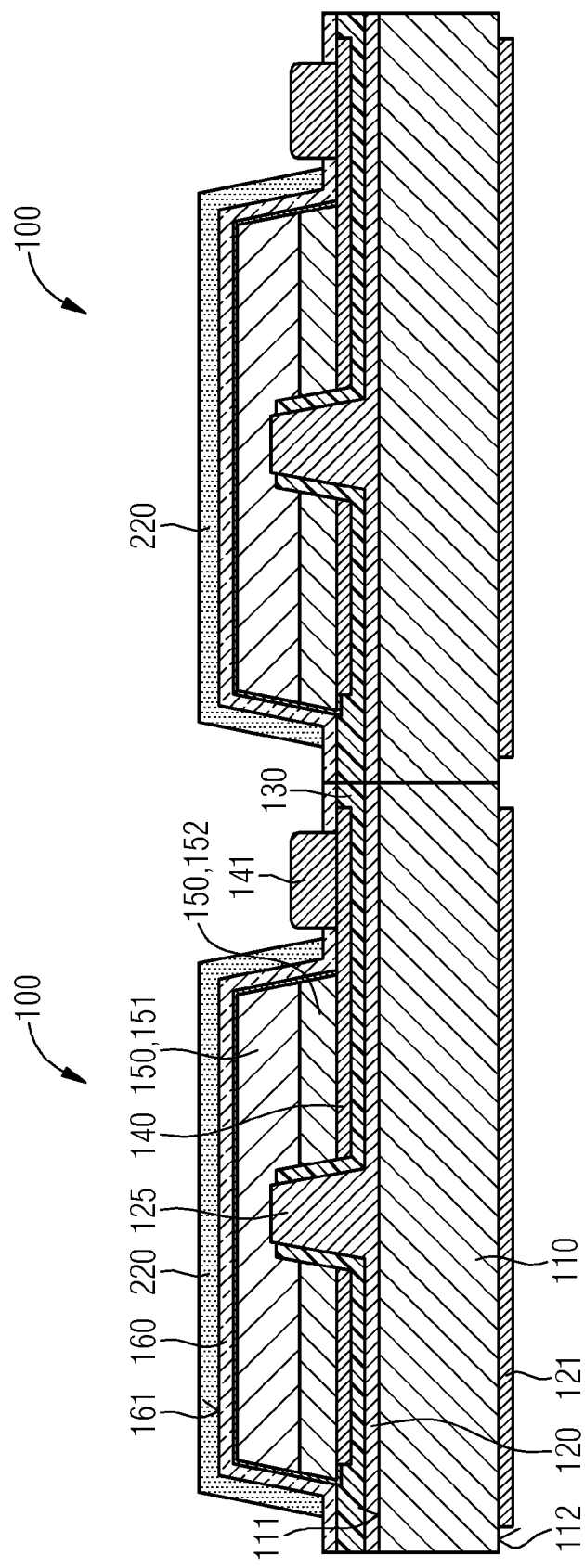
FIG. 10 shows a sectional view through optoelectronic semiconductor chips for producing an optoelectronic semiconductor component in accordance with a second embodiment.
Figure 11:
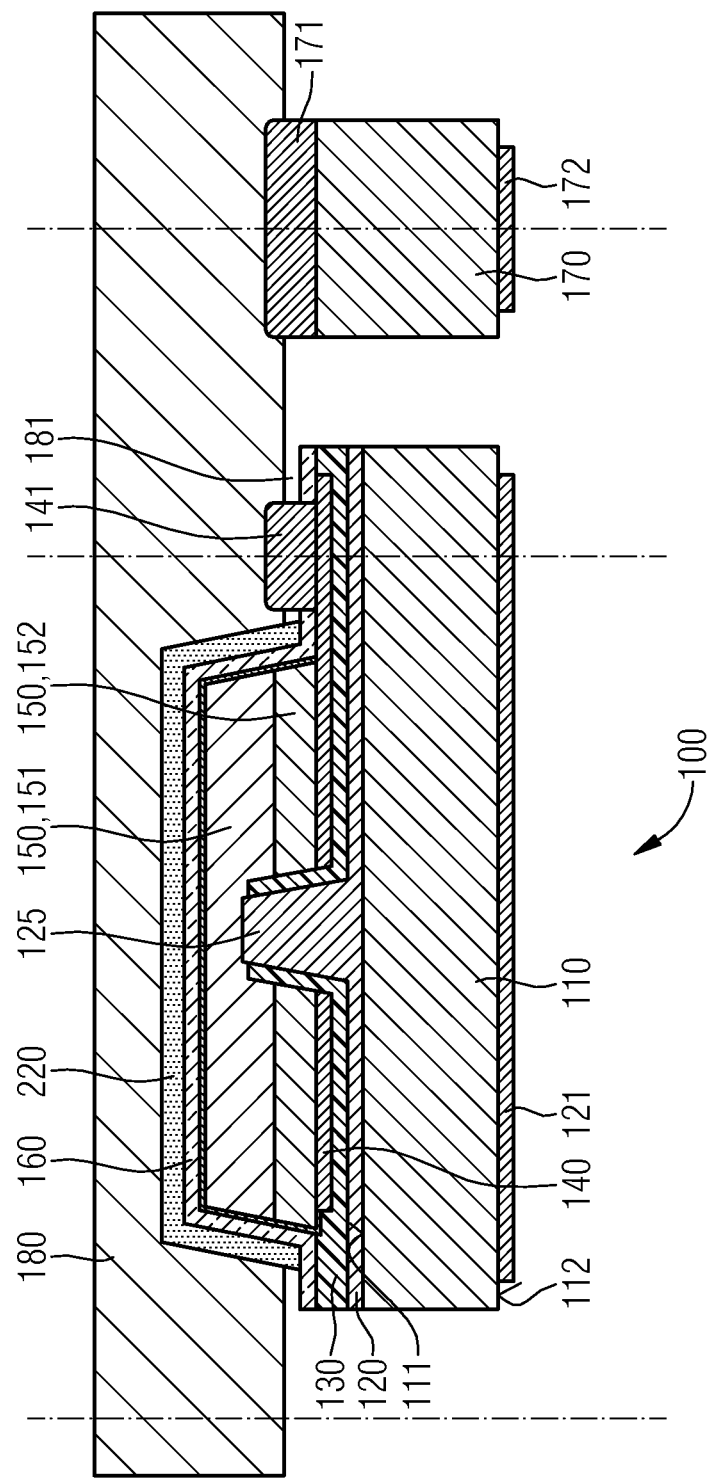
FIG. 11 shows a sectional view through the optoelectronic semiconductor component in accordance with the second embodiment in a second processing state.

A further processing step involves creating a third metallization 210 having a mirror section 211 and a contact section 212 on the top side 191 of the mold body 190 with the embedded optoelectronic semiconductor chip 100 and the embedded conductor pin 170. FIG. 8 shows a sectional illustration of the optoelectronic semiconductor component 10 obtained after this method step. FIG. 9 shows a plan view of the optoelectronic semiconductor component 10.

The contact section 212 of the third metallization 210 produces an electrically conductive connection between the second contact area 141 of the optoelectronic semiconductor chip 100 and the top side metallization 171 of the conductor pin 100. The contact section 212 is thus arranged on the second contact area 141, the top side metallization 171 and the insulation section 200 arranged between the contact area 141 and the top side metallization 171.

In the case of the optoelectronic semiconductor component 10, there is an electrically conductive connection between the underside metallization 172 of the conductor pin 170 present via the conductor pin 170, the top side metallization 171 of the conductor pin 170 and the contact section 212 of the third metallization 210 to the second contact area 141 of the optoelectronic semiconductor chip 100. The second contact area 141 of the optoelectronic semiconductor chip 100 is electrically conductively connected to the p-doped region 152 of the semiconductor 150, as already explained. From the n-doped region 151 of the semiconductor 150, as already explained, there is an electrically conductive connection to the first contact area 121 of the optoelectronic semiconductor chip 100. Consequently, the optoelectronic semiconductor chip 100 of the optoelectronic semiconductor component 10 can be electrically contacted via the first contact area 121 and the underside metallization 172, both of which are accessible at the underside 192 of the mold body 190 of the optoelectronic semiconductor component 10. As a result, the optoelectronic semiconductor component 10 is suitable for mounting according to an SMT method (surface mount technology).

If, during the operation of the optoelectronic semiconductor component 10, an electrical voltage is applied between the first contact area 121 of the optoelectronic semiconductor chip 100 and the underside metallization 172 of the conductor pin 170, then said voltage is also dropped across the insulation section 200 between the contact section 212 and the first metallization 120 of the optoelectronic semiconductor chip 100. Thickness and electrical breakdown strength of the insulation section 200 are dimensioned such that no electrical breakdown occurs in this case.

The mirror section 211 of the third metallization 210 is separated and electrically insulated from the contact section 212 of the third metallization 210 by lateral separating trenches. The mirror section 211 covers a large part of the top side 191 of the mold body 190. However, the mirror section 211 does not or substantially does not cover the emission region 161 of the optoelectronic semiconductor chip 100. In those regions of the mold body 190 in which neither the optoelectronic semiconductor chip 100 nor the conductor pin 170 are arranged, the mirror section 211 of the third metallization 210 covers at least 50% of the top side 191 of the mold body 190, preferably at least 90%. In the example illustrated in FIGS. 8 and 9, the mirror section 211 almost completely covers the top side 191 of the mold body 190 outside the optoelectronic semiconductor chip 100 and the conductor chip 170.

The third metallization 210 can comprise silver (Ag), for example. In this case, the third metallization 210 has a high electrical conductivity and a good optical reflectivity. Alternatively, the third metallization 210 can also comprise aluminum (Al), which is obtainable more cost-effectively than silver and is associated with a lower risk of corrosion. A combination with a dielectric mirror is possible in both cases. The third metallization 210 can also be embodied as a metal stack and comprise, for example, titanium (Ti) and chromium (Cr), nickel (Ni), palladium (Pd) and platinum (Pt), copper (Cu) or silver (Ag) and aluminum (Al).

If light generated in the semiconductor 150 of the optoelectronic semiconductor chip 100 is emitted through the emission region 161 of the optoelectronic semiconductor chip 100 and is reflected back to the optoelectronic semiconductor component 10 in the surroundings of the optoelectronic semiconductor component 10, then this reflected-back light is reflected again at the mirror section 211 of the third metallization 210 in the emission direction of the optoelectronic semiconductor component 10. This light can be utilized as a result. Without the mirror section 211, the light reflected in the direction of the optoelectronic semiconductor component 10 would be absorbed at the top side 191 of the mold body 190 and be lost as a result. The mirror section 211 of the third metallization 210 thereby increases an effective luminous flux of the optoelectronic semiconductor component 10. For this purpose, the mirror section 211 must cover at least half of the top side 191 of the mold body 190, preferably at least 90%.

The third metallization 210 having the mirror section 211 and the contact section 212 was created by means of a photolithographic method. In one embodiment of the method, the third metallization 210 was firstly deposited over the whole area on the top side 191 of the mold body 190, the top side and the emission region 161 of the optoelectronic semiconductor chip 100 and the top side metallization 171 of the conductor pin 170. Optionally, the third metallization was passivated after deposition. Subsequently, those regions of the third metallization 210 which form the mirror section 211 and the contact section 212 in the illustrations in FIGS. 8 and 9 were protected by means of a photoresist, and the third metallization 210 was removed in the unprotected regions by means of an etching method. The separating regions between the mirror section 211 and the contact section 212 and also the separating trenches surrounding the mirror section 211 were created in the process. Moreover, in the process the third metallization 210 was removed in the emission region 161 of the optoelectronic semiconductor chip 100.

In a different embodiment of the method, the emission region 161 of the optoelectronic semiconductor chip 100 and the region of the separating trenches created later between the mirror section 211 and the contact section 212 and those created all around the mirror section 211 are firstly protected by means of a photoresist. The third metallization 210 is subsequently deposited and then removed again by a lift-off method in the regions previously protected by means of photoresist. In this case, the third metallization 210 remains in the mirror section 211 and in the contact section 212. In this variant, the third metallization 210 can be deposited, for example, by sputtering, vapor deposition or an electrolytic method.

Alternatively, the third metallization 210 can also be applied by printing of metal pastes by means of screen or stencil printing or by jetting of metal pastes.

In one preferred embodiment of the method described with reference to FIGS. 2 to 9, a plurality of optoelectronic semiconductor chips 100 and a corresponding plurality of conductor pins 170 spaced apart from one another laterally are simultaneously embedded into a common mold body 190. Insulation sections 200 are then created simultaneously between the second contact areas 141 of all the optoelectronic semiconductor chips 100 and the top side metallizations 171 of the respectively assigned conductor pins 170. The third metallization 210 having mirror section 211 and contact section 212 is also created in parallel for all optoelectronic semiconductor chips 100 embedded into the common mold body 190. It is only then that the optoelectronic semiconductor components 10 produced are separated from one another by the mold body 190 being divided.

A further embodiment of a method for producing an optoelectronic semiconductor component comprising the optoelectronic semiconductor chip 100 is explained below with reference to FIGS. 10 to 18. The optoelectronic semiconductor component produced according to the method explained with reference to FIGS. 10 to 18 corresponds to the optoelectronic semiconductor component 10 in some aspects. Mutually corresponding component parts are therefore provided with the same reference signs and are not described in detail again.

FIG. 10 shows once again a sectional illustration of the optoelectronic semiconductor chip 100 still situated in a wafer assemblage with further optoelectronic semiconductor chips 100.

With the optoelectronic semiconductor chip 100 still in the wafer assemblage, a layer of photoresist 220 was created on the top side of the passivation 160. In this case, the photoresist 220 covers only that part of the passivation 160 which in turn covers the semiconductor 150. The second contact area 141 is not covered by the photoresist 220. The photoresist 220 is created by means of a phototechnique.

The optoelectronic semiconductor chip 100 is subsequently separated from the wafer assemblage with the further optoelectronic semiconductor chips 100.

Afterward, the top side of the optoelectronic semiconductor chip 100 having the photoresist 220 is again pressed into a film 180. In this case, however, the optoelectronic semiconductor chip 100 is pressed into the film 180 only to an extent such that the regions covered by the photoresist 220 and the top side of the second contact area 141 of the optoelectronic semiconductor chip 100 are in contact with the film 180. By contrast, those regions of the passivation 160 of the optoelectronic semiconductor chip 100 which are not covered by the photoresist 220 do not come into contact with the film 180. A gap 181 thus remains between these regions of the passivation 160 and the film 180.

At the same time as the optoelectronic semiconductor chip 100, once again a conductor pin 170 having a top side metallization 171 and an underside metallization 172 is pressed into the film 180 in such a way that the top side metallization 171 is covered and protected by the film 180. Once again, a film for protection can also be arranged at the underside 112 of the substrate 110 having the first contact area 121 and at the underside metallization 172 of the conductor pin 170.

Figure 12:
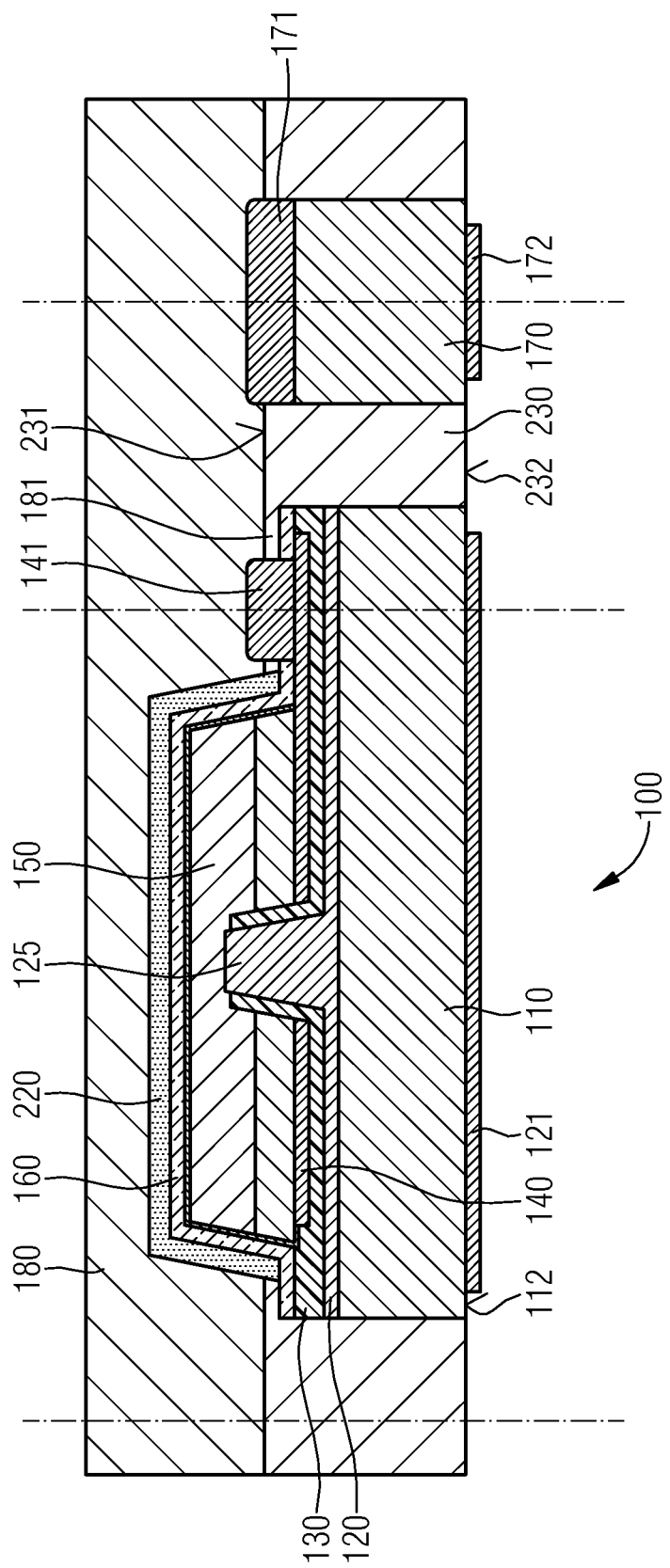
FIG. 12 shows a sectional view through the optoelectronic semiconductor component in accordance with the second embodiment in a third processing state.

The optoelectronic semiconductor chip 100 and the conductor pin 170 are subsequently embedded into a mold body 230, as is shown in the sectional illustration in FIG. 12. The mold body 230 is in turn formed from a molding compound and is electrically insulating. In this case, the molding compound also advances into the gap 181 between the film 180 and that part of the passivation 160 of the optoelectronic semiconductor chip 100 which is not covered by the photoresist 220.

Figure 13:
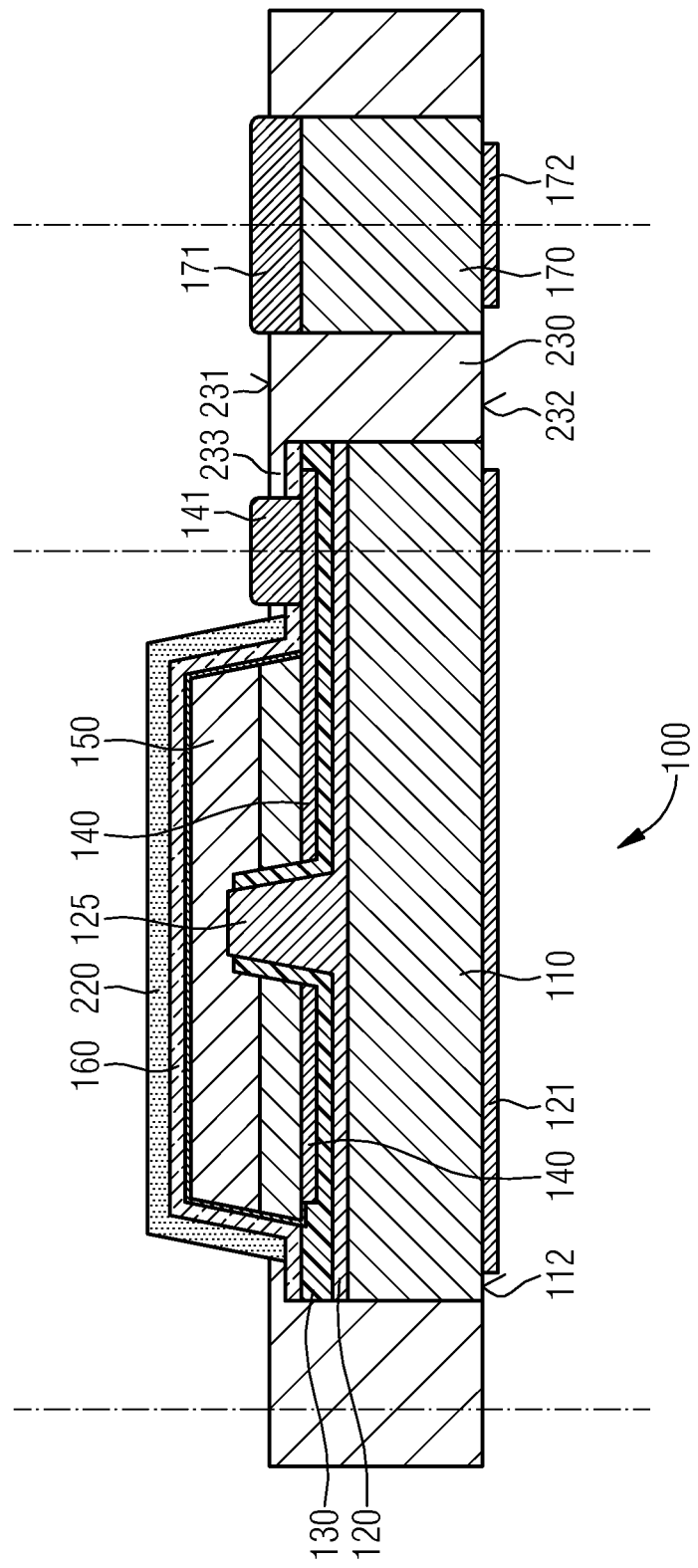
FIG. 13 shows a sectional view through the optoelectronic semiconductor component in accordance with the second embodiment in a fourth processing state.

FIG. 13 shows a sectional view through the mold body 230 with the optoelectronic semiconductor chip 100 embedded into the mold body 230 and the conductor pin 170 embedded into the mold body 230 after the removal of the film 180. The mold body 230 has a top side 231 and an underside 232. The underside 232 of the mold body 230 terminates flush with the underside 112 of the substrate 110 of the optoelectronic semiconductor chip 100 and the underside of the conductor pin 170. Consequently, the first contact area 121 arranged on the underside 112 of the substrate 110 of the optoelectronic semiconductor chip 100 and the underside metallization 171 at the underside of the conductor pin 170 are not covered by the mold body 230, but rather are accessible at the underside 232 of the mold body 230.

The top side of the optoelectronic semiconductor chip 100 is partly covered by the mold body 230. In the region of the gap 181 formed in the preceding method step between the film 180 and the passivation 160, an insulation section 233 of the mold body 230 has formed, which is arranged above those sections of the passivation 160 of the optoelectronic semiconductor chip 100 which are not covered by the photoresist 220.

By contrast, the regions of the optoelectronic semiconductor chip 100 which are covered by the photoresist 220 and the top side of the second contact area 141 of the optoelectronic semiconductor chip 100 are not covered by the mold body 230, but rather are raised above the top side 231 of the mold body 230. The top side metallization 171—previously protected by the film 180—of the conductor pin 170 is also accessible at the top side 231 of the mold body 230.

Figure 14:
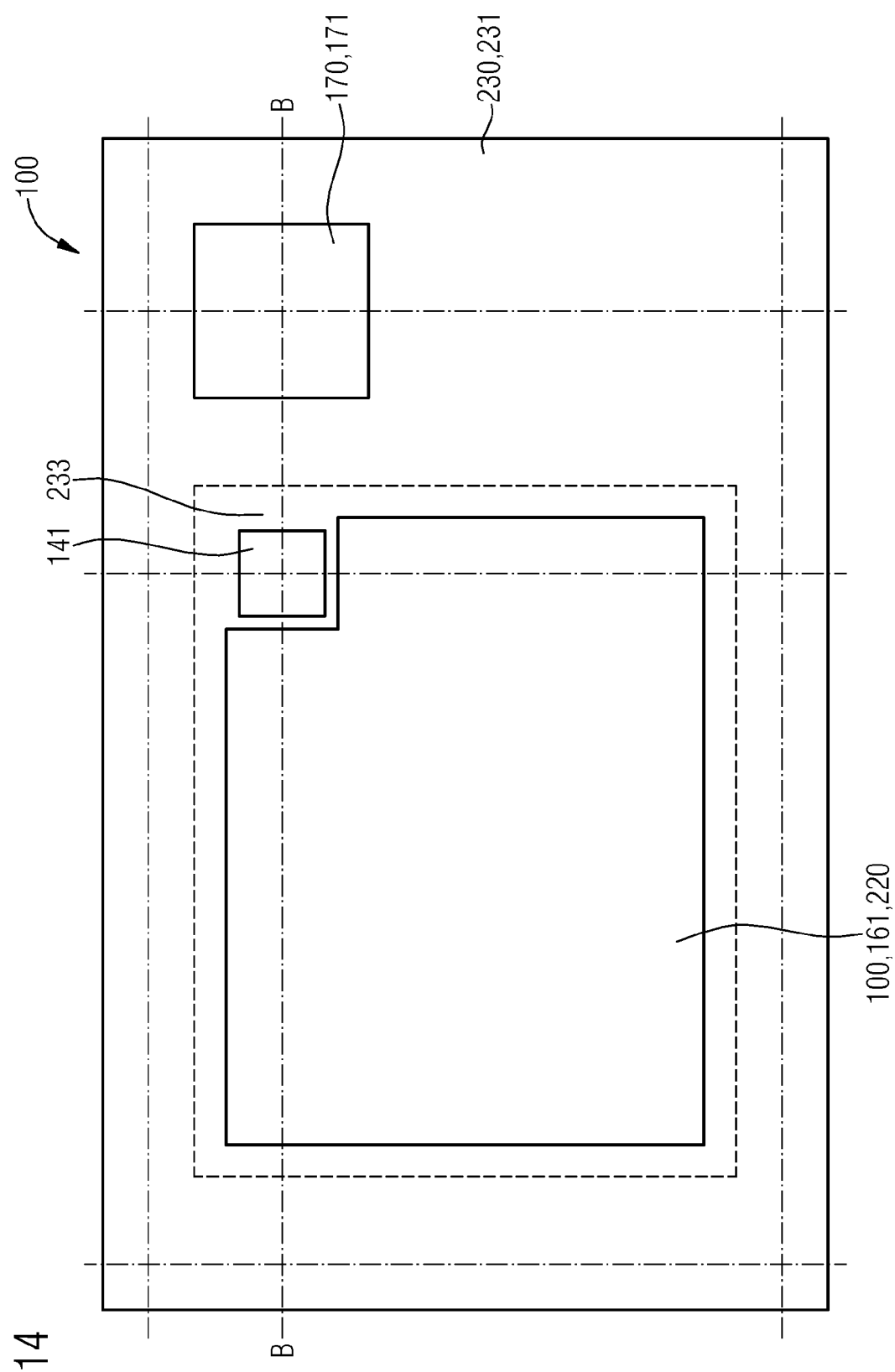
FIG. 14 shows a plan view of the optoelectronic semiconductor component in accordance with the second embodiment in the fourth processing state.

FIG. 14 shows a plan view of the top side 231 of the mold body 230, the emission region 161—protected by the photoresist 220—of the optoelectronic semiconductor chip 100, the second contact area 141 of the optoelectronic semiconductor chip 100 and the top side metallization 171 of the conductor pin 170. The illustration likewise shows a sectional line BB, along which the optoelectronic semiconductor chip 100, the conductor pin 170 and the mold body 230 are cut in sectional view in the illustration in FIG. 13.

Figure 15:
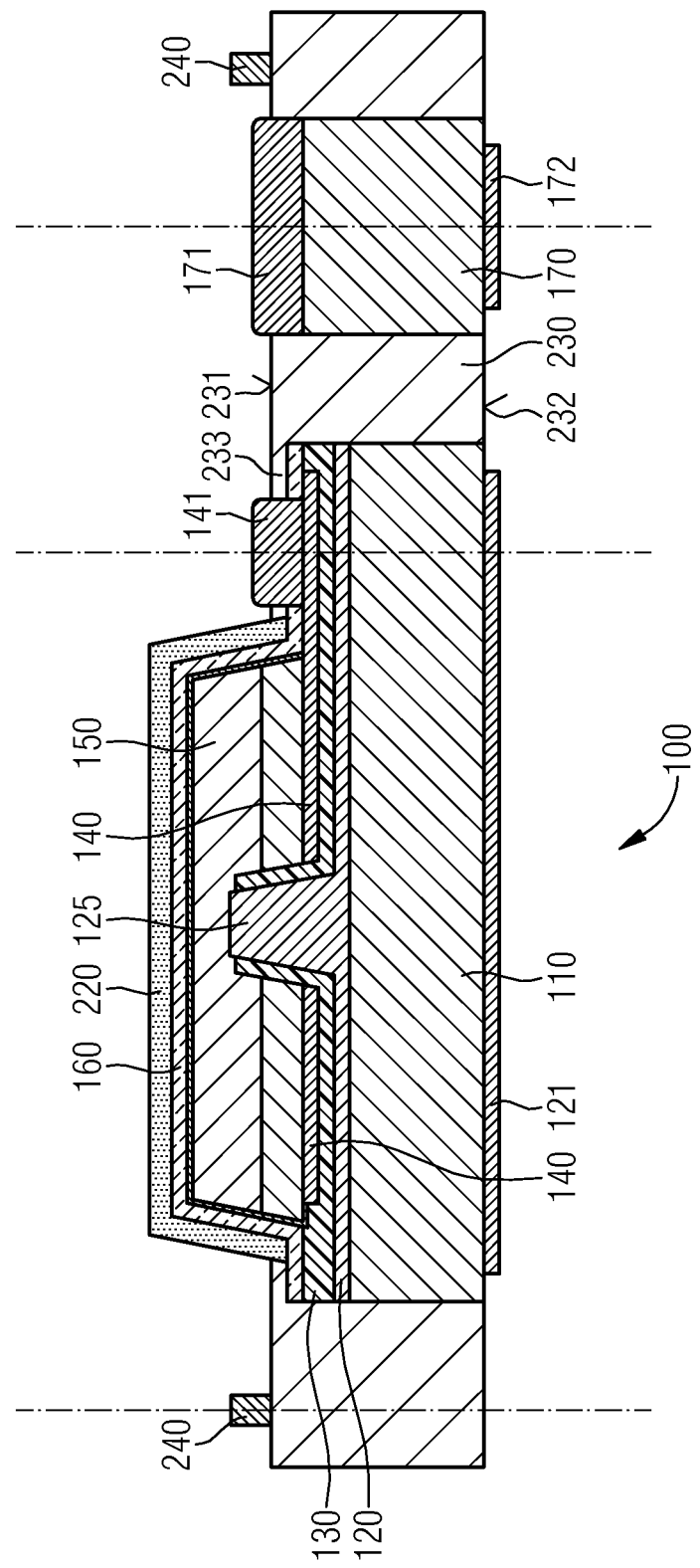
FIG. 15 shows a sectional view through the optoelectronic semiconductor component in accordance with the second embodiment in a fifth processing state.
Figure 16:
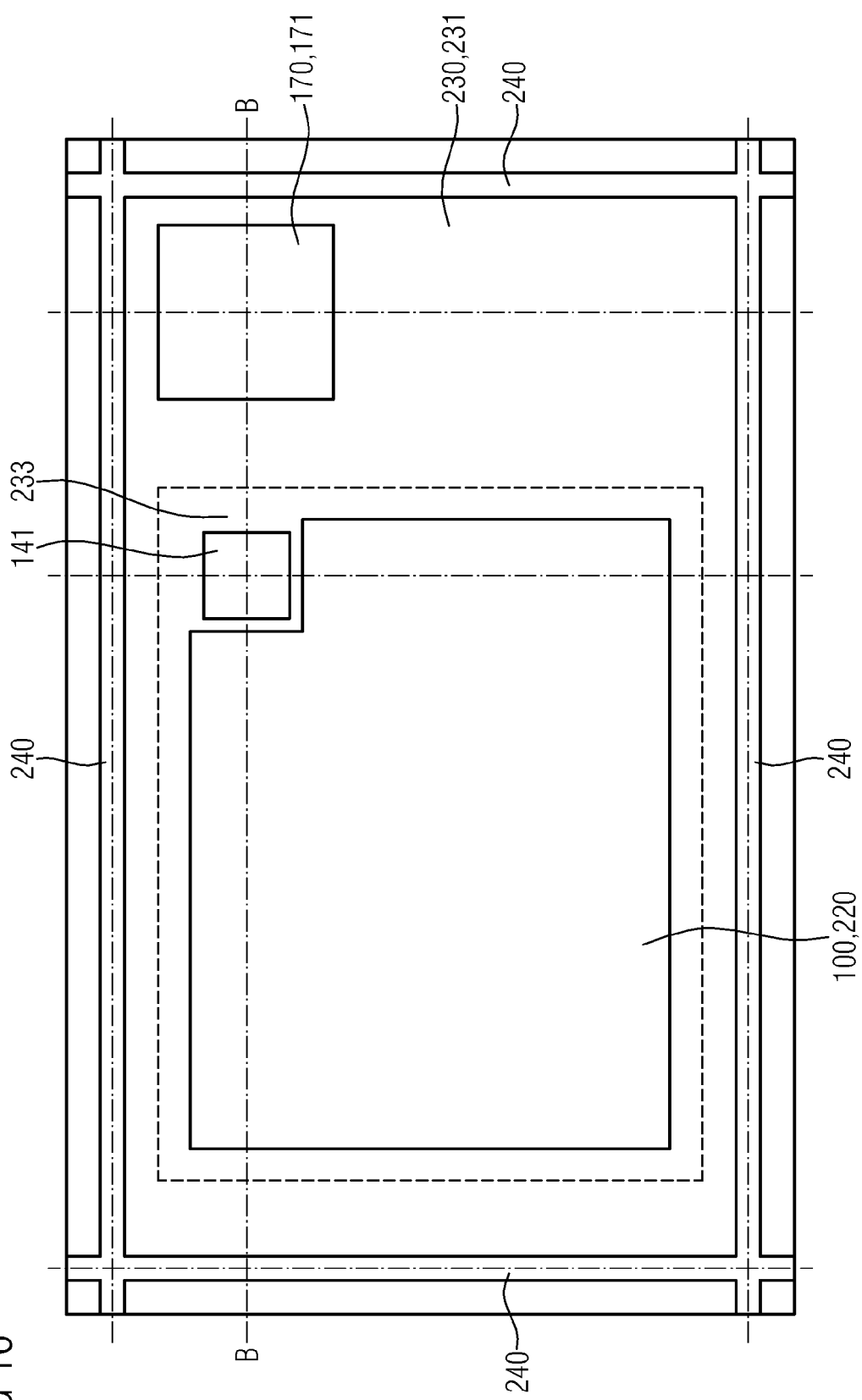
FIG. 16 shows a plan view of the optoelectronic semiconductor component in accordance with the second embodiment in the fifth processing state.

In a subsequent method step, further photoresist 240 is deposited and patterned on the top side 231 of the mold body 230. This is carried out by means of a phototechnique which, however, can advantageously be performed without stringent requirements made of an alignment accuracy. The patterned further photoresist 240 covers regions of the top side 231 of the mold body 230 at which later there are intended to be separating trenches in a fourth metallization. FIG. 15 shows a sectional view through the mold body 230 with the patterned further photoresist 240. FIG. 16 shows a plan view of the top side 231 with the further photoresist 240 and the photoresist 220 in the emission region 161 of the optoelectronic semiconductor chip 100.

Figure 17:
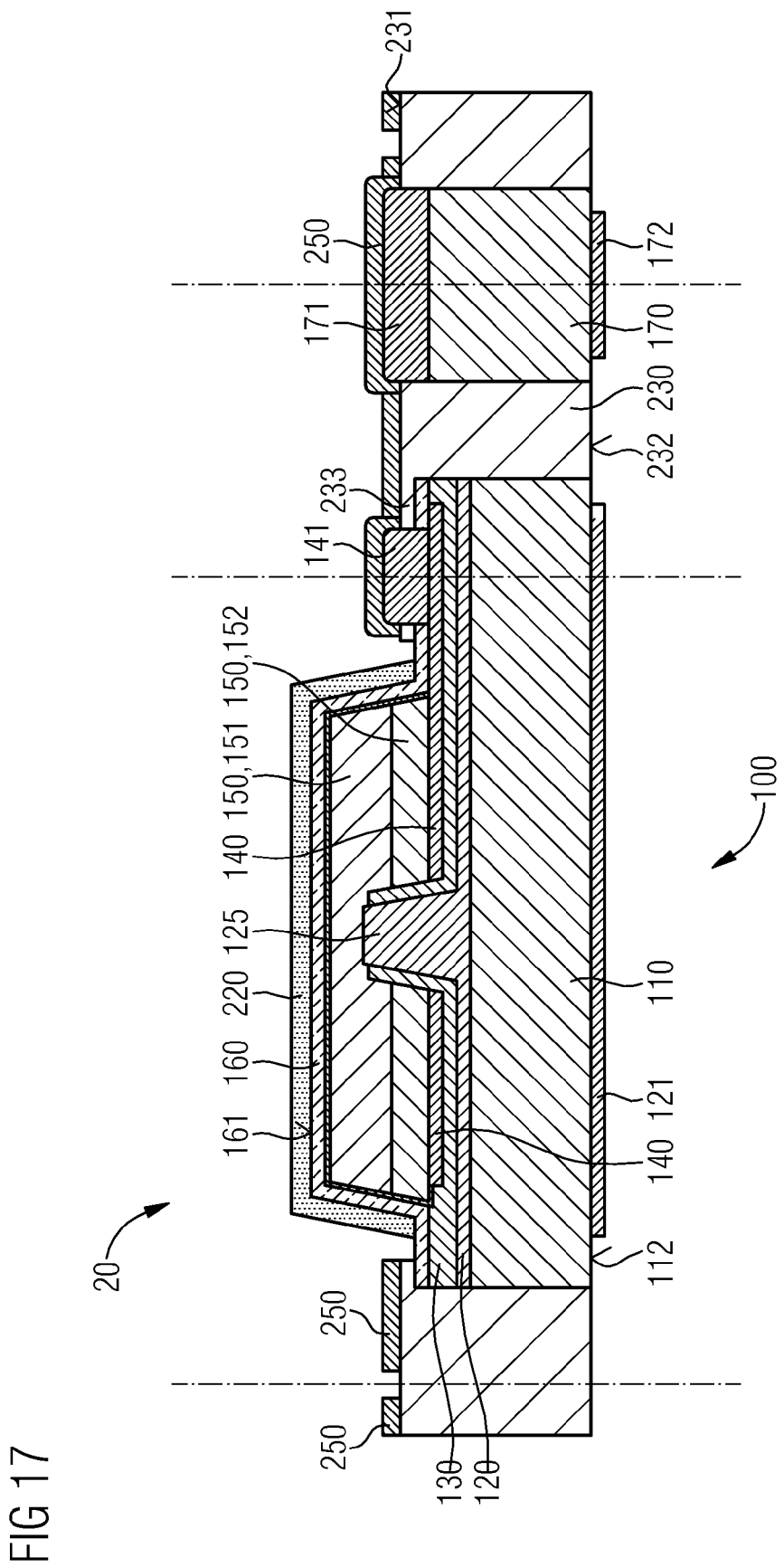
FIG. 17 shows a sectional view through the optoelectronic semiconductor component in accordance with the second embodiment.
Figure 18:
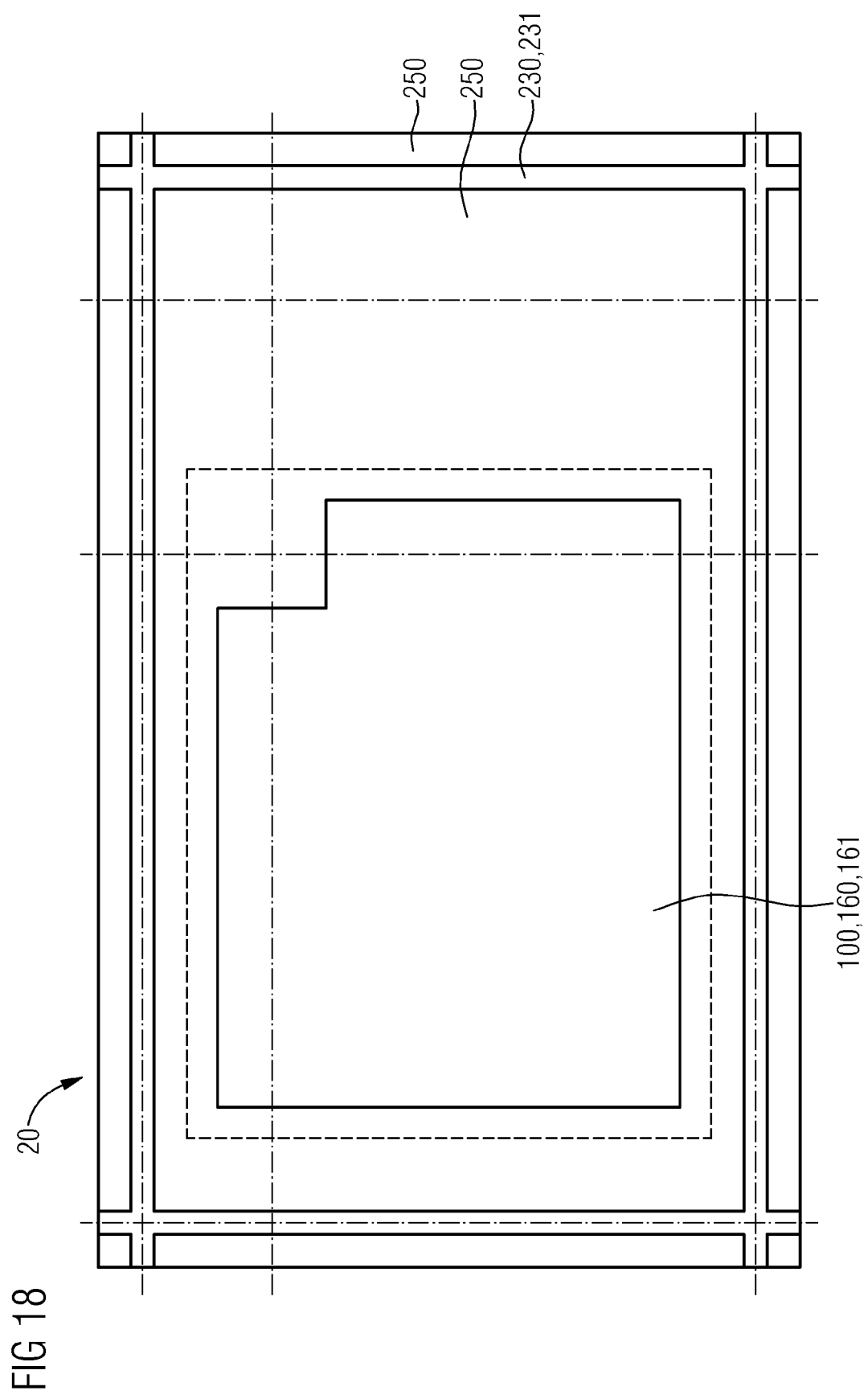
FIG. 18 shows a plan view of the optoelectronic semiconductor component in accordance with the second embodiment.

In a subsequent production step, a metallic layer is deposited over the whole area on the top side 231 of the mold body 230, the photoresist 220 and the further photoresist 240. In a lift-off process, the photoresist 220 and the further photoresist 240 with the parts of the metallic layer situated thereon are subsequently removed. A fourth metallization 250 remains. This completes the production of an optoelectronic semiconductor component 20 in accordance with a second embodiment. FIG. 17 shows a sectional illustration of the optoelectronic semiconductor component 20. FIG. 18 shows a plan view of the optoelectronic semiconductor component 20.

The fourth metallization 250 covers the second contact area 141 of the optoelectronic semiconductor chip 100, the insulation section 233 of the mold body 230 and the top side metallization 171 of the conductor pin 170 and thus produces an electrically conductive connection between the second contact area 141 of the optoelectronic semiconductor chip 100 and the top side metallization 171 of the conductor pin 170. Consequently, there is an electrically conductive connection between the underside metallization 172 of the conductor pin 170 at the underside 232 of the mold body 230 and the n-doped region 151 of the semiconductor 150. As a result, the optoelectronic semiconductor component 20 is also suitable for surface mounting by means of SMT methods, wherein the optoelectronic semiconductor chip 100 of the optoelectronic semiconductor component 20 is contacted via the first contact area 121 and the underside metallization 172.

During the operation of the optoelectronic semiconductor component 20, the insulation section 233 of the mold body 230 prevents an electrical breakdown from occurring between the fourth metallization 250 and the first metallization 120, the substrate 110 or the first contact area 121 of the optoelectronic semiconductor chip 100. For this purpose, the insulation section 233 must have a sufficient insulation strength. During the operation of the optoelectronic semiconductor component 20, a potential difference of 5 V, for example, can occur between the fourth metallization 250 and the first metallization 120. The mold body 230 can comprise an epoxy resin having an electrical breakdown strength of 30 kV/mm, for example. In this exemplary case, the insulation section 233 should have a thickness of at least 200 nm. Generally, the insulation section 233 will have a thickness of between 50 nm and 500 nm. In this case, the thickness of the insulation section 233 results from the height of the gap 181 in the method step illustrated in FIG. 11 during the production of the optoelectronic semiconductor component 20. The insulation section 233 therefore becomes thinner, the further the optoelectronic semiconductor chip 100 is pressed into the film 180 during the method step illustrated in FIG. 11. If the optoelectronic semiconductor chip 100 were not pressed into the film 180 at all, then this would result in a thickness of the insulation section 233 which corresponds to the height of the semiconductor 150 and can be 5 μm, for example. Unrequired pressing of the semiconductor chip 100 into the film 180 advantageously simplifies the production method.

The fourth metallization 250 additionally covers a large part of the top side 231 of the mold body 230 in the lateral regions of the mold body 230 in which neither the optoelectronic semiconductor chip 100 nor the conductor pin 170 are embedded. In these regions of the mold body 230, the fourth metallization 250 covers at least 50% of the top side 231 of the mold body 230, preferably at least 90%.

The fourth metallization 250 preferably consists of a material having good optical reflectivity, particularly preferably of silver. Alternatively, the fourth metallization 250 can also comprise aluminum (Al), which is obtainable more cost-effectively than silver and is associated with a lower risk of corrosion. A combination with a dielectric mirror is possible in both cases. The fourth metallization 250 can also be embodied as a metal stack and comprise, for example, titanium (Ti) and chromium (Cr), nickel (Ni), palladium (Pd) and platinum (Pt), copper (Cu) or silver (Ag) and aluminum (Al). The fourth metallization 250 serves as a mirror layer for reflecting light. Light which is generated in the semiconductor 150 of the optoelectronic semiconductor chip 100 of the optoelectronic semiconductor component 20 and is guided out through the emission region 161 can be reflected back to the optoelectronic semiconductor component 20 in the surroundings of the optoelectronic semiconductor component 20. This light reflected back to the optoelectronic semiconductor component 20 would be absorbed at the top side 131 of the mold body 230 and thus be lost if the metallization 250 acting as a mirror layer were not arranged on the top side 231. The fourth metallization 150 once again reflects the light reflected back in the direction of the optoelectronic semiconductor component 20, as a result of which said light can indeed still be supplied for a utilization.

The fourth metallization 250 is enclosed in a lateral direction on the outside by separating trenches in which the fourth metallization 250 is removed and the top side 231 of the mold body 230 is exposed. These are the lateral regions in which the further photoresist 240 was arranged in the preceding method step.

The method for producing the optoelectronic semiconductor component 20 as explained with reference to FIGS. 10 to 18 is also preferably carried out in parallel for a plurality of optoelectronic semiconductor components 20. For this purpose, a plurality of optoelectronic semiconductor chips 100 and a corresponding plurality of conductor pins 170 spaced apart from one another laterally are simultaneously pressed into the film 180 and subsequently embedded into a common mold body 230. The application and patterning of the further photoresist 240 are also carried out in parallel for all optoelectronic semiconductor chips 100 embedded into the common mold body 230 simultaneously. It is only after the deposition and patterning of the fourth metallization 250 that the finished processed optoelectronic semiconductor components 20 are separated from one another by the division of the common mold body 230. The division of the mold body 230 is preferably carried out in the region of the separating trenches arranged around the fourth metallization 250 of each individual optoelectronic semiconductor component 20.

Figure 19:
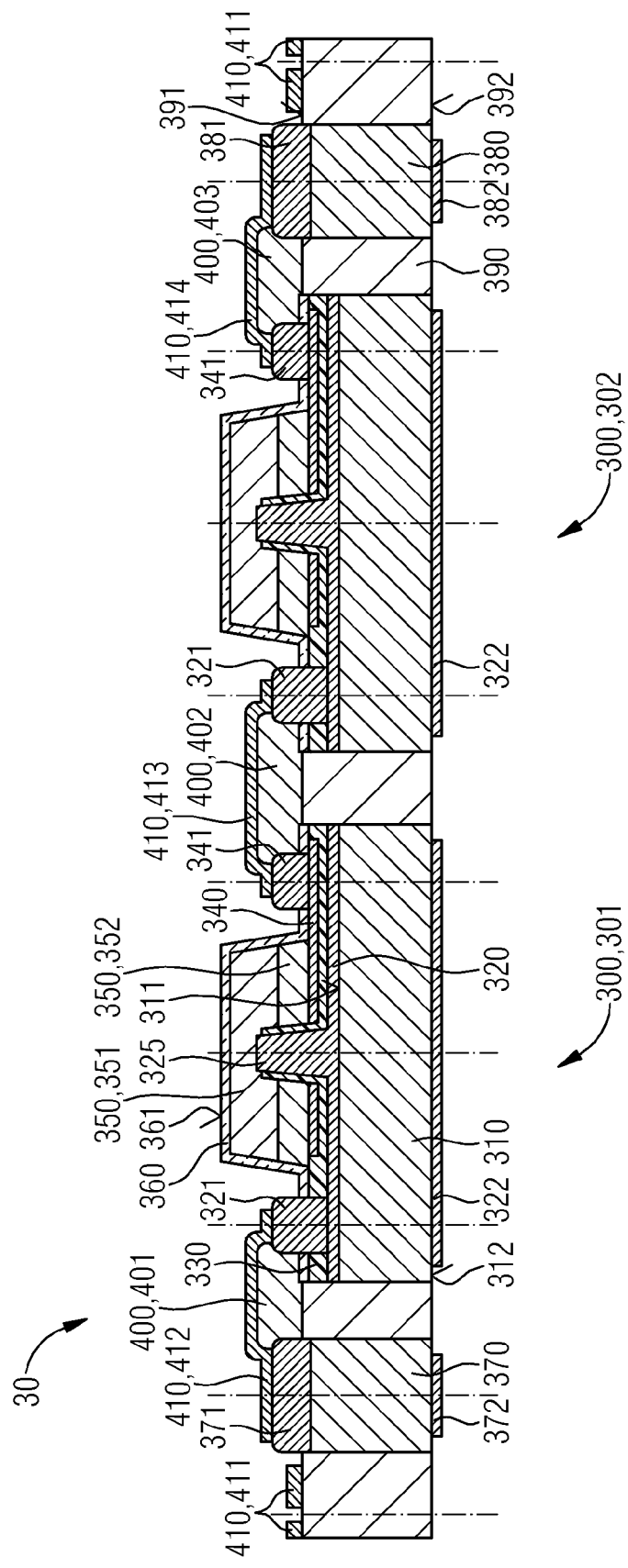
FIG. 19 shows a sectional view through an optoelectronic semiconductor component in accordance with a third embodiment.
Figure 20:
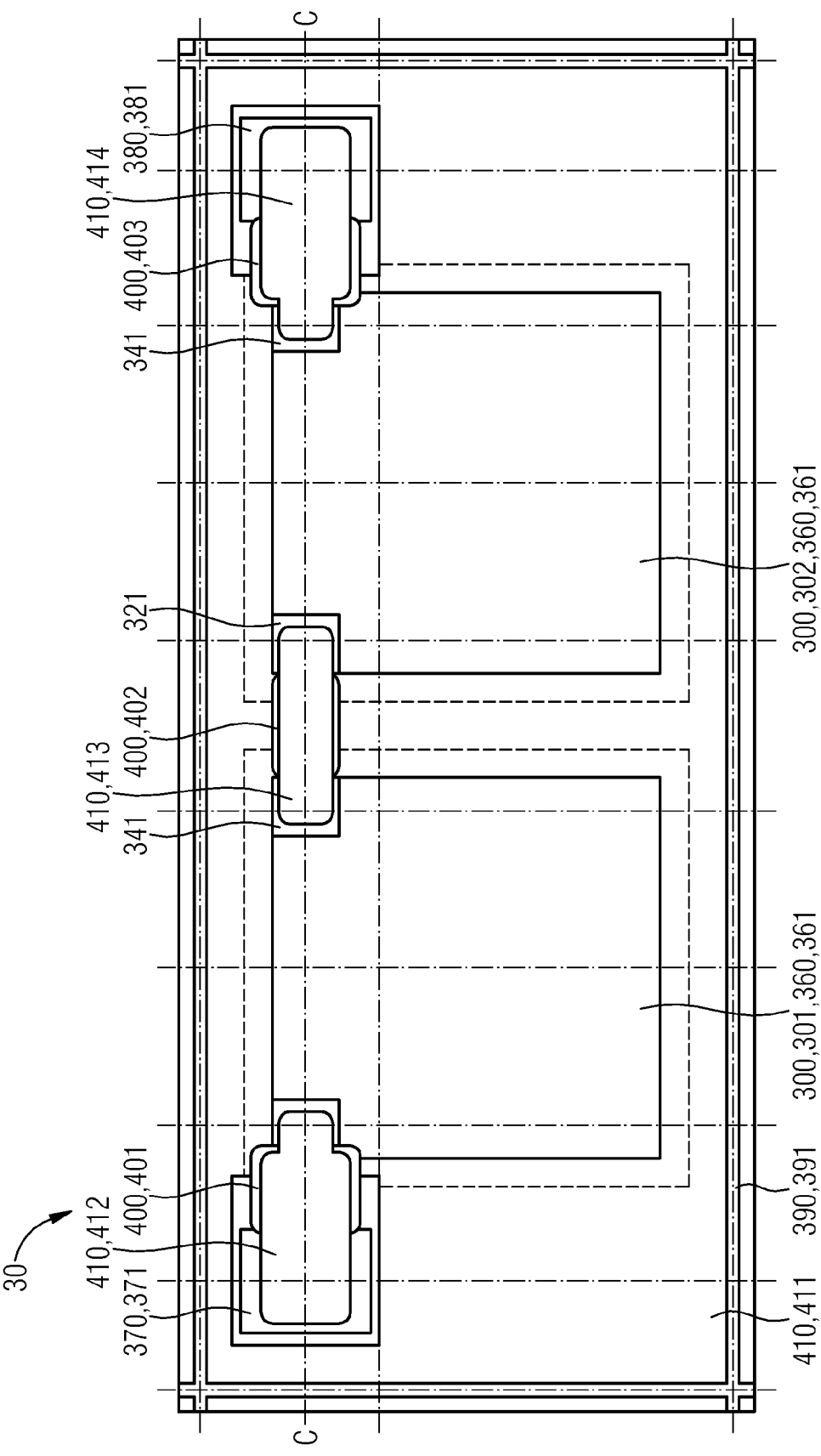
FIG. 20 shows a plan view of the optoelectronic semiconductor component in accordance with the third embodiment.

FIG. 19 shows a schematic sectional illustration of an optoelectronic semiconductor component 30 in accordance with a third embodiment. FIG. 20 shows a plan view of the optoelectronic semiconductor component 30 of the third embodiment. Moreover, FIG. 20 shows a sectional line CC, along which the optoelectronic semiconductor component 30 was cut in sectional view in the illustration in FIG. 19.

In the example illustrated, the optoelectronic semiconductor component 30 comprises two optoelectronic semiconductor chips 300, which are designated as first chip 301 and as second chip 302. In further embodiments, however, the optoelectronic semiconductor component 30 could also comprise only one optoelectronic semiconductor chip 300 or more than two optoelectronic semiconductor chips 300 connected in series. The first chip 301 and the second chip 302 are embodied identically. One optoelectronic semiconductor chip 300 is explained below by way of example.

The optoelectronic semiconductor chip 300 comprises an epitaxially grown semiconductor 350 having an n-doped region 351 and a p-doped region 352. The semiconductor 350 can comprise gallium nitride (GaN), for example. An active light emitting layer is formed between the n-doped region 351 and the p-doped region 352. Light generated in the semiconductor 350 can be guided out from the semiconductor 350 through an emission region 361 formed by a surface of the n-doped region 351.

The semiconductor 350 has a through contact 325. The through contact 325 comprises an opening extending from a side of the p-doped region 352 which faces away from the n-doped region 351 through the p-doped region 352 right into the n-doped region 351. The lateral walls of said opening are electrically insulated by an insulation layer 330. An electrically conductive material of a first metallization 320 is arranged within the opening. The through contact 325 can also comprise a plurality of parallel openings of this type.

A second metallization 340 is arranged on that surface of the p-doped region 352 which faces away from the n-doped region 351, said second metallization providing an electrically conductive connection to the p-doped region 352. The second metallization 340 extends beyond the semiconductor 350 in a lateral direction and is electrically conductively provided with a second contact area 341 laterally alongside the semiconductor 350.

The second metallization 340 is covered by the insulation layer 330 on the side facing away from the semiconductor 350. Adjacent to the insulation layer 330 is the first metallization 320, which is electrically conductively connected to the through contact 325 and is electrically insulated from the second metallization 340 by the insulation layer 330. The first metallization 320 is electrically conductively connected to a first contact area 321. From the first contact area 321, via the first metallization 320 and the through contact 325 there is an electrically conductive connection to the n-doped region 351 of the semiconductor 350.

The first metallization 320 is arranged on a top side 311 of a substrate 310. The semiconductor 350 may firstly have been produced separately from the substrate 310 and been provided with the through contact 325, the second metallization 340, the second contact area 341, the insulation layer 330, the first metallization 320 and the first contact area 321. Afterward, the first metallization 320 may have been connected by epitaxial bonding to a solder layer arranged on the top side 311 of the substrate 310.

The substrate 310 is an electrically insulating substrate and can comprise silicon, for example. The substrate 310 preferably has a high thermal conductivity. A thermal contact area 322, which can comprise a metal, for example, is arranged on an underside 312 of the substrate 310. Waste heat produced by the semiconductor 350 can be dissipated via the substrate 310 and the thermal contact area 322.

A passivation 360 is arranged on that side of the semiconductor 350, of the second metallization 340 and of the insulation layer 330 which faces away from the substrate 310. In the region of the first contact area 321 and the second contact area 341, the passivation 360 has perforations, such that the first contact area 321 and the second contact area 341 are accessible.

The first chip 301 and the second chip 302 are jointly embedded into a mold body 390. The mold body 390 has been produced from a molding compound by a molding process and is electrically insulating. The mold body 390 has a top side 391 and an underside 392. The underside 392 of the mold body 390 terminates flush with the undersides 312 of the substrates 310 of both optoelectronic semiconductor chips 300. In this case, the undersides 312 of the substrates 310 are not covered by the mold body 390, such that the thermal contact areas 322 at the undersides 312 of the optoelectronic semiconductor chips 300 are accessible.

The top side 391 of the mold body 390 terminates flush with the passivations 360 of the optoelectronic semiconductor chips 300 in those regions of the passivations 360 which are located laterally alongside the semiconductors 350. Consequently, the first contact areas 321, the second contact areas 341 and the emission regions 361 of the optoelectronic semiconductor chips 300 are raised above the top side 391 of the mold body 390 and are not covered by the mold body 390.

In addition to the optoelectronic semiconductor chips 300, a first conductor pin 370 and a second conductor pin 380 are embedded into the mold body 390, which in each case provide an electrically conductive connection between the top side 391 and the underside 392 of the mold body 390. For this purpose, the first conductor pin 370 and the second conductor pin 380 consist of an electrically conductive material, for example, of a printed circuit board material. The first conductor pin 370 has a top side metallization 371 and an underside metallization 372. The second conductor pin 380 has a top side metallization 381 and an underside metallization 382. The top side metallizations 371, 381 of the conductor pins 370, 380 are accessible at the top side 391 of the mold body 390. The underside metallizations 372, 382 of the conductor pins 370, 380 are accessible at the underside 392 of the mold body 390.

A plurality of insulation sections 400 are arranged on the top side 391 of the mold body 390. Each insulation section 400 consists of an electrically insulating material, for example, of a photopatterned dielectric, for instance of benzocyclobutene (BCB). Alternatively, the insulation sections 400 can comprise organic materials such as acrylates, epoxides, silicones, polyimides, or inorganic materials such as silicon oxide, silicon nitride. The thicknesses of the insulation sections 400 are once again dimensioned such that they prevent an electrical breakdown at electrical voltages that usually occur during the operation of the optoelectronic semiconductor chip 300. The thickness of the insulation sections 400 can be between 50 nm and 500 nm, for example. If the insulation sections 400 are applied by means of jetting or by a screen printing process, however, the thickness can also be several pm and can be in the range of between 20 μm and 100 μm, for example.

A first insulation section 401 is arranged in a lateral region of the top side 391 of the mold body 390 between the top side metallization 371 of the first conductor pin 370 and the first contact area 321 of the first optoelectronic semiconductor chip 301. A second insulation section 402 is arranged in the lateral region of the top side 391 of the mold body 390 between the second contact area 341 of the first optoelectronic semiconductor chip 301 and the first contact area 321 of the second optoelectronic semiconductor chip 302. A third insulation section 403 is arranged on the top side 391 of the mold body 390 in a lateral region between the second contact area 341 of the second optoelectronic semiconductor chip 300 and the top side metallization 381 of the second conductor pin 380.

The optoelectronic semiconductor component 30 additionally comprises a third metallization 410, which is arranged on the top side 391 of the mold body 390 and in sections on the insulation sections 400. The third metallization 410 preferably consists of a material having good electrical conductivity and high optical reflectivity, for example, of silver. Alternatively, the third metallization 410 can also comprise aluminum (Al), which is obtainable more cost-effectively than silver and is associated with a lower risk of corrosion. A combination with a dielectric mirror is possible in both cases. The third metallization 410 can also be embodied as a metal stack and comprise, for example, titanium (Ti) and chromium (Cr), nickel (Ni), palladium (Pd) and platinum (Pt), copper (Cu) or silver (Ag) and aluminum (Al).

The third metallization 410 comprises a mirror section 411, a first contact section 412, a second contact section 413 and a third contact section 414. The mirror section 411, the first contact section 412, the second contact section 413 and the third contact section 414 are separated from one another and thereby electrically insulated from one another in a lateral direction by separating trenches.

The first contact section 412 produces an electrically conductive connection between the top side metallization 371 of the first conductor pin 370 and the first contact area 321 of the first optoelectronic semiconductor chip 301. The second contact section 413 produces an electrically conductive connection between the second contact area 341 of the first optoelectronic semiconductor chip 301 and the first contact area 321 of the second optoelectronic semiconductor chip 302. The third contact section 414 produces an electrically conductive connection between the second contact area 341 of the second optoelectronic semiconductor chip 302 and the top side metallization 381 of the second conductor pin 380.

The third insulation section 403 arranged between the third contact section 414 and the top side 391 of the mold body 390 prevents an electrical breakdown between the third contact section 414 and the first metallization 320 of the second optoelectronic semiconductor chip 302. The second insulation section 402 correspondingly prevents an electrical breakdown between the second contact section 413 and the first metallization 320 of the first optoelectronic semiconductor chip 300.

In an embodiment of the optoelectronic semiconductor component 30 comprising only one optoelectronic semiconductor chip 300, 301, the second contact area 341 of this optoelectronic semiconductor chip 300, 301 is directly connected to the top side metallization 381 of the second conductor chip 380 by means of a contact section. The third contact section 414 and the third insulation section 403 are omitted in this embodiment.

The optoelectronic semiconductor component 30 can be electrically contacted via the underside metallization 372 of the first conductor pin 370 and the underside metallization 382 of the second conductor pin 380. The optoelectronic semiconductor component 30 is suitable for surface mounting according to an SMT method. In this case, the thermal contact areas 322 can also be contacted in order to dissipate heat produced by the optoelectronic semiconductor chips 300.

The mirror section 411 of the third metallization 410 covers a large part of the top side 391 of the mold body 390 of those regions of the mold body 390 in which neither the optoelectronic semiconductor chips 300 nor the conductor pins 370, 380 are arranged. In these lateral regions of the mold body 390, the mirror section 411 covers at least 50% of the top side 391 of the mold body 390, preferably at least 90%. As a result, the top side 391 of the mold body 390 is substantially optically reflective. The emission regions 361 of the optoelectronic semiconductor chips 300 are not covered by the mirror section 411 of the third metallization 410.

The optoelectronic semiconductor component 30 can be produced according to the method explained with reference to FIGS. 1 to 9. An essential difference between the optoelectronic semiconductor component 30 and the optoelectronic semiconductor component 10 is that, in the case of the optoelectronic semiconductor chips 300, the electrical contacts 321, 341 of both polarities are accessible at their top side. Therefore, the optoelectronic semiconductor chips 300 have an insulating substrate 310, while the optoelectronic semiconductor chips 100 have a conductive substrate 110.

Figure 21:
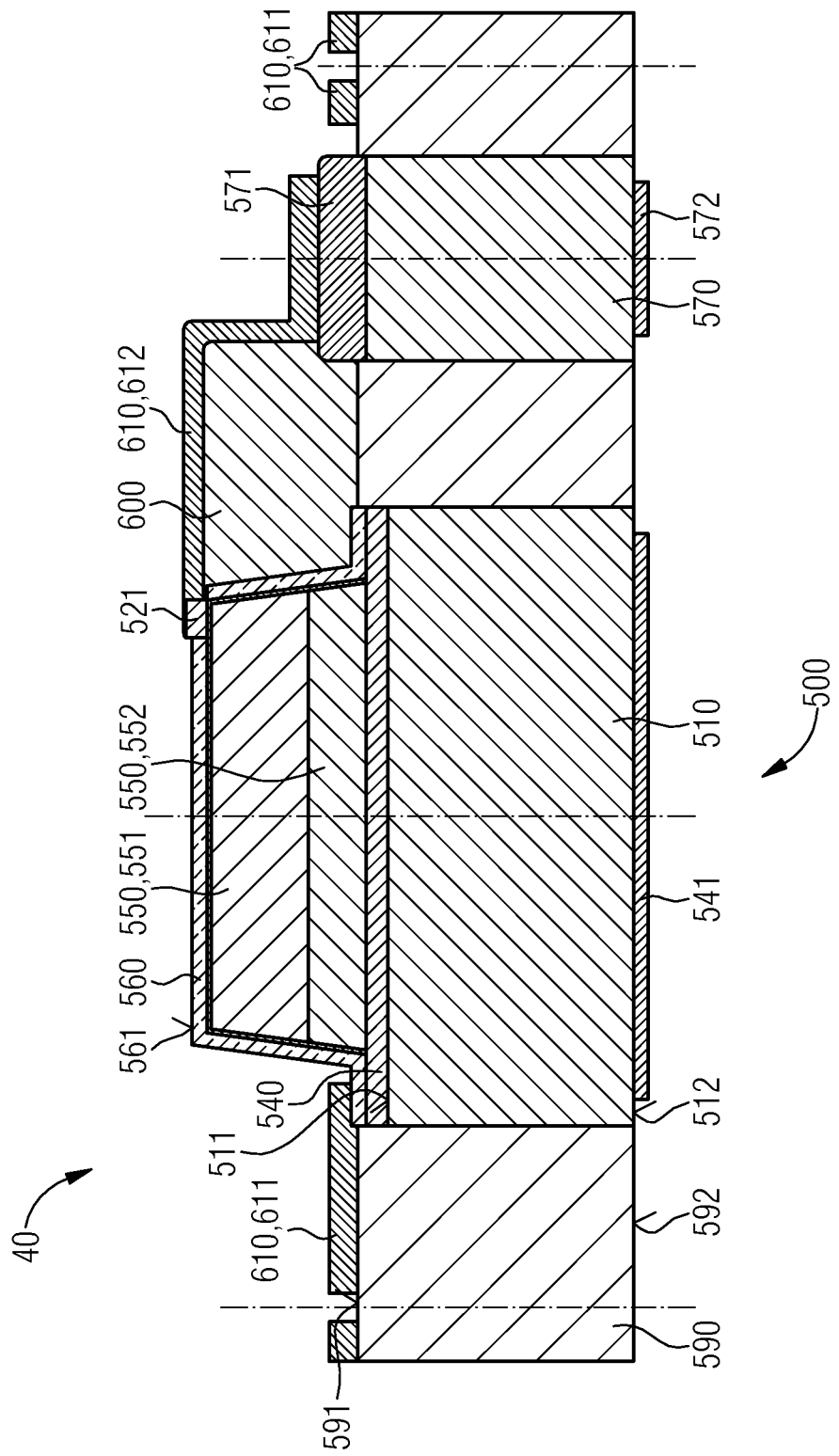
FIG. 21 shows a sectional view through an optoelectronic semiconductor component in accordance with a fourth embodiment.
Figure 22:
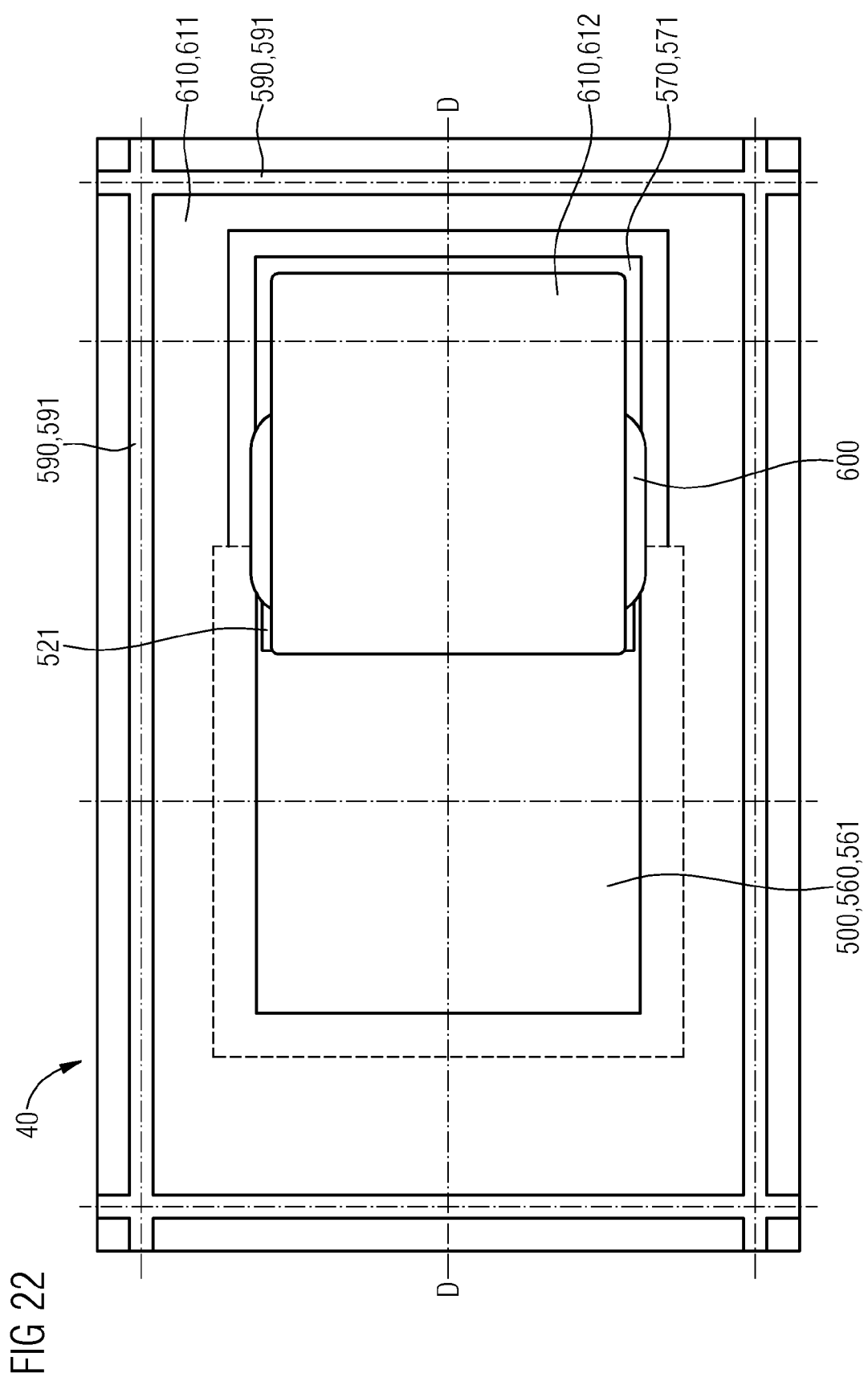
FIG. 22 shows a plan view of the optoelectronic semiconductor component in accordance with the fourth embodiment.

FIG. 21 shows an optoelectronic semiconductor component 40 in accordance with a fourth embodiment in a schematic sectional illustration. FIG. 22 shows a plan view of the optoelectronic semiconductor component 40 in accordance with the fourth embodiment. Moreover, FIG. 22 shows a sectional line DD, along which the optoelectronic semiconductor component 40 was cut in sectional view in the illustration in FIG. 21.

The optoelectronic semiconductor component 40 comprises an optoelectronic semiconductor chip 500. The optoelectronic semiconductor chip 500 comprises a semiconductor 550 having an n-doped region 551 and a p-doped region 552. The semiconductor 550 is once again present as an epitaxially produced crystal and can comprise gallium nitride (GaN), for example. The p-doped region 552 is arranged on a metallization 540 on a top side 511 of an electrically conductive substrate 510. The substrate 510 can comprise silicon, for example. A second contact area 541, which can comprise a metal, for example, is arranged at an underside 512 of the substrate 510. The second contact area 541 provides an electrical connection to the p-doped region 552 of the semiconductor 550 via the conductive substrate 510 and the metallization 540.

A first contact area 521 is arranged on a surface of the n-doped region 551 of the semiconductor 550, via which first contact area there is an electrically conductive connection to the n-doped region 551 of the semiconductor 550.

The semiconductor 550 and the sections of the metallization 540 which are arranged alongside the semiconductor 550 in a lateral direction are covered by a passivation 560. The passivation 560 has a perforation in the region of the first contact area 521, such that the first contact area 521 at the top side of the optoelectronic semiconductor chip 500 is accessible. A region of the n-doped region 551 of the semiconductor 550 that is protected by the passivation 560 forms an emission region 561, through which light can be coupled out from the semiconductor 550.

The optoelectronic semi-chip 500 is embedded into an electrically insulating mold body 590. The mold body 590 has been produced from a molding compound with the aid of a molding process and in this respect corresponds to the mold bodies 190, 230, 390 of the embodiments described above. The mold body 590 has a top side 591 and an underside 592. The underside 592 of the mold body 590 terminates flush with the underside 512 of the substrate 510. The second contact area 541 at the underside 512 of the substrate 510 is not covered by the mold body 590 and is therefore accessible from outside. The top side 591 of the mold body 590 once again terminates with the lateral sections of the passivation 560 which do not cover the semiconductor 550. Consequently, the emission region 561 of the semiconductor 550 is not covered by the mold body 590.

Together with the optoelectronic semiconductor chip 500, a conductor pin 570 is embedded into the mold body 590, which provides an electrically conductive connection between the top side 591 and the underside 592 of the mold body 590. The conductor pin 570 has a top side metallization 571 and an underside metallization 572. The top side metallization 571 is accessible at the top side 591 of the mold body 590. The underside metallization 572 is accessible at the underside 592 of the mold body 590.

In a lateral region between the semiconductor 550 and the top side metallization 571 of the conductor pin 570, an insulation section 600 is arranged on the top side 591 of the mold body 590. The insulation section 600 consists of an electrically insulating material, for example, of a photopatterned dielectric such as benzocyclobutene. Alternatively, the insulation section 600 can comprise organic materials such as acrylates, epoxides, silicones, polyimides, or inorganic materials such as silicon oxide, silicon nitride.

The optoelectronic semiconductor component 40 furthermore comprises a third metallization 610 having a mirror section 611 and a contact section 612. The third metallization 610 can comprise silver. Alternatively, the third metallization 610 can also comprise aluminum (Al). A combination with a dielectric mirror is possible in both cases. The third metallization 610 can also be embodied as a metal stack and comprise, for example, titanium (Ti) and chromium (Cr), nickel (Ni), palladium (Pd) and platinum (Pt), copper (Cu) or silver (Ag) and aluminum (Al). The contact section 612 extends between the first contact area 521 of the optoelectronic semiconductor chip 500 over the insulation section 600 to the top side metallization 571 of the conductor pin 570 and electrically conductively connects the first contact area 521 to the conductor pin 570. The thickness of the insulation section 600 is once again dimensioned such that an electrical breakdown between the contact section 612 of the third metallization 610 and the metallization 540 of the optoelectronic semiconductor chip 500 is prevented at voltages that occur during the operation of the optoelectronic semiconductor component 40.

The mirror section 611 is separated and electrically insulated from the contact section 612 of the third metallization 610 in a lateral direction by separating trenches. The mirror section 611 is arranged on those parts of the top side 591 of the mold body 590 at which neither the optoelectronic semiconductor chip 500, nor the conductor chip 570 nor the insulation section 600 is arranged. The mirror section 611 covers at least 50%, preferably at least 90%, of those parts of the top side 591 of the mold body 590.

During the operation of the optoelectronic semiconductor component 40, light generated in the semiconductor 550 is guided out through the emission region 561. Reflections can occur in the surroundings of the optoelectronic semiconductor component 40, as a result of which part of the light radiation generated by the optoelectronic semiconductor component 40 is reflected back to the optoelectronic semiconductor component 40. In order to prevent said light radiation from being absorbed at the top side 591 of the mold body 590 and thereby being lost, the mirror section 611 is arranged on the top side 591 of the mold body 590. The light is once again reflected at the mirror section 611 and can thereby leave the optoelectronic semiconductor component 40. The usable proportion of the light generated by the optoelectronic semiconductor component 40 increases as a result.

The optoelectronic semiconductor component 40 can be produced by means of the method explained with reference to FIGS. 1 to 9. Alternatively, however, it is also possible to use the optoelectronic semiconductor chips 300 in FIGS. 19 and 20 or the optoelectronic semiconductor chip 500 in FIGS. 21 and 22 for producing an optoelectronic semiconductor component according to the method explained with reference to FIGS. 10 to 18.

The optoelectronic semiconductor components 10, 20, 30, 40 respectively have conductor pins 170, 370, 380, 570 which provide electrically conductive connections (through contacts) between the top sides and the undersides of the respective mold bodies 190, 230, 390, 590. In variants of the methods described, the embedding of the conductor pins 170, 370, 380, 570 into the mold body 190, 230, 390, 590 can be dispensed with. Instead, after the production of the mold bodies 190, 230, 390, 590, openings can be created in the mold bodies 190, 230, 390, 590, for example, by a laser. The holes created in the mold bodies 190, 230, 390, 590 can be filled with an electrically conductive material, for example, by electrolytic methods. The electrically conductive material then provides an electrically conductive connection between the top side and the underside of the mold bodies 190, 230, 390, 590 and thus likewise forms a through contact. The rest of the production steps proceed as described.

The invention has been illustrated and described in greater detail on the basis of the preferred exemplary embodiments. Nevertheless, the invention is not restricted to the examples disclosed. Rather, other variations can be derived therefrom by the person skilled in the art, without departing from the scope of protection of the invention.

The invention claimed is:

1. An optoelectronic semiconductor component comprising:
    an optoelectronic semiconductor chip;
    an electrically insulating mold body having a top side and an underside, wherein the semiconductor chip is embedded into the mold body;
    a through contact embedded into the mold body, the through contact forming an electrically conductive connection between the top side and the underside of the mold body; and
    a reflective layer arranged on the top side of the mold body, the reflective layer forming an electrically conductive connection between an electrical contact of the semiconductor chip and the through contact, wherein the reflective layer covers at least 50% of the top side of the mold body and wherein electric contacts of the optoelectronic semiconductor component are electrically accessible at the underside of the mold body.

2. The optoelectronic semiconductor component as claimed in claim 1,
    wherein a top side of the semiconductor chip is oriented in the same direction as the top side of the mold body;
    wherein the top side of the semiconductor chip is a radiation emission surface of the semiconductor chip; and
    wherein at least one part of the top side of the semiconductor chip is covered by neither the mold body nor the reflective layer.

3. The optoelectronic semiconductor component as claimed in claim 2, wherein the mold body covers a part of the top side of the semiconductor chip.

4. The optoelectronic semiconductor component as claimed in claim 3, wherein the mold body above the part of the top side of the semiconductor chip has a thickness of between 50 nm and 500 nm.

5. The optoelectronic semiconductor component as claimed in claim 1, wherein, in a region of the electrically conductive connection between the electrical contact of the semiconductor chip and the through contact, a dielectric is arranged between the top side of the mold body and the reflective layer.

6. The optoelectronic semiconductor component as claimed in claim 5, wherein the dielectric comprises benzocylobutene.

7. The optoelectronic semiconductor component as claimed in claim 5, wherein the dielectric has a thickness of between 50 nm and 500 nm.

8. The optoelectronic semiconductor component as claimed in claim 5,
    wherein a first section of the reflective layer is electrically insulated from a second section of the reflective layer; and
    wherein the first section forms the electrically conductive connection between the electrical contact of the semiconductor chip and the through contact.

9. The optoelectronic semiconductor component as claimed in claim 1, wherein the reflective layer comprises silver or aluminum.

10. A method for producing an optoelectronic semiconductor component, the method comprising:
    embedding an optoelectronic semiconductor chip and a through contact in a mold body having a top side and an underside, wherein the through contact forms an electrically conductive connection between the top side and the underside of the mold body; and
    arranging a reflective layer on the top side of the mold body;
    wherein the reflective layer forms an electrically conductive connection between an electrical contact of the semiconductor chip and the through contact;
    wherein the reflective layer covers at least 50% of the top side of the mold body; and
    wherein electric contacts of the optoelectronic semiconductor component are created, which are accessible at the underside of the mold body.

11. The method as claimed in claim 10, wherein, in a region of the electrically conductive connection between the electrical contact of the semiconductor chip and the through contact, a dielectric is arranged between the top side of the mold body and the reflective layer.

12. The method as claimed in claim 11, wherein the dielectric is formed on the top side of the mold body using a first photolithographic process step.

13. The method as claimed in claim 10, wherein the reflective layer is arranged and patterned on the top side of the mold body using a second photolithographic process step.

14. The method as claimed in claim 10, wherein a first photoresist is arranged on a top side of the semiconductor chip before the semiconductor chip is embedded into the mold body.

15. The method as claimed in claim 14, wherein the first photoresist is arranged on the top side of the semiconductor chip while the semiconductor chip is situated in a wafer assemblage with further semiconductor chips.

16. The method as claimed in claim 14, wherein a second photoresist is arranged on the top side of the mold body before the reflective layer is arranged on the top side of the mold body.

17. An optoelectronic semiconductor component comprising:
- an optoelectronic semiconductor chip;
- an electrically insulating mold body having a top side and an underside, wherein the semiconductor chip is embedded in the mold body;
- a through contact embedded in the mold body, the through contact forming an electrically conductive connection between the top side and the underside of the mold body;
- a reflective layer arranged on the top side of the mold body, the reflective layer forming an electrically conductive connection between an electrical contact of the semiconductor chip and the through contact;
- wherein the reflective layer covers at least 50% of the top side of the mold body;
- wherein in the region of the electrically conductive connection between the electrical contact of the semiconductor chip and the through contact a dielectric is arranged between the top side of the mold body and the reflective layer;
- wherein a first section of the reflective layer is electrically insulated from a second section of the reflective layer; and
- wherein the first section forms the electrically conductive connection between the electrical contact of the semiconductor chip and the through contact.

* * * * *